(12) United States Patent
Moheimani et al.

(10) Patent No.: US 11,650,222 B2
(45) Date of Patent: *May 16, 2023

(54) METHODS AND DEVICES CONFIGURED TO OPERATED SCANNING TUNNELING MICROSCOPES USING OUT-OF-BANDWIDTH FREQUENCY COMPONENTS ADDED TO BIAS VOLTAGE AND RELATED SOFTWARE

(71) Applicant: Board of Regents, The University of Texas System, Austin, TX (US)

(72) Inventors: Seyed Omid Reza Moheimani, Allen, TX (US); Hamed Alemansour, Richardson, TX (US)

(73) Assignee: BOARD OF REGENTS, THE UNIVERSITY OF TEXAS SYSTEM, Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/490,925

(22) Filed: Sep. 30, 2021

(65) Prior Publication Data

US 2022/0082582 A1    Mar. 17, 2022

Related U.S. Application Data

(63) Continuation of application No. 17/089,214, filed on Nov. 4, 2020, now Pat. No. 11,143,671.
(Continued)

(51) Int. Cl.
*G01Q 10/06* (2010.01)
*H01J 37/31* (2006.01)
(Continued)

(52) U.S. Cl.
CPC ........... *G01Q 10/065* (2013.01); *G01Q 60/10* (2013.01); *G01Q 80/00* (2013.01); *H01J 37/26* (2013.01);
(Continued)

(58) Field of Classification Search
CPC ................... H01J 37/28; H01J 37/3174; H01J 2237/2818; G01Q 10/065; G01Q 60/10; G01Q 80/00
(Continued)

(56) References Cited

U.S. PATENT DOCUMENTS 11,143,671 B2 * 10/2021 Moheimani ............. H01J 37/26
2007/0012874 A1    1/2007 Kim
(Continued)

OTHER PUBLICATIONS

Randall, et al., Highly ParallelScanning Tunneling Microscope Based Hydrogen Depassivation Lithography; J. Vac. Sci. Technol. B 36 06JL05 (2018); 12 pages.

*Primary Examiner* — Nicole M Ippolito
(74) *Attorney, Agent, or Firm* — Stanek Lemon Crouse & Meeks, P.A.

(57) ABSTRACT

In the system and method disclosed, an ultrahigh vacuum (UHV) scanning tunneling microscope (STM) tip is used to selectively desorb hydrogen atoms from the Si(100)-2X1:H surface by injecting electrons at a negative sample bias voltage. A new lithography method is disclosed that allows the STM to operate under imaging conditions and simultaneously desorb H atoms as required. A high frequency signal is added to the negative sample bias voltage to deliver the required energy for hydrogen removal. The resulted current at this frequency and its harmonics are filtered to minimize their effect on the operation of the STM's feedback loop. This approach offers a significant potential for controlled and precise removal of hydrogen atoms from a hydrogen-terminated silicon surface and thus may be used for the fabrication of practical silicon-based atomic-scale devices.

16 Claims, 15 Drawing Sheets

Related U.S. Application Data

(60) Provisional application No. 62/930,383, filed on Nov. 4, 2019.

(51) Int. Cl.
| | |
|---|---|
| *G01Q 60/10* | (2010.01) |
| *H01J 37/28* | (2006.01) |
| *G01Q 80/00* | (2010.01) |
| *H01J 37/00* | (2006.01) |
| *H01J 37/317* | (2006.01) |
| *H01J 37/26* | (2006.01) |

(52) U.S. Cl.
CPC .......... *H01J 37/28* (2013.01); *H01J 37/3174* (2013.01); *H01J 2237/2818* (2013.01)

(58) Field of Classification Search
USPC .................. 250/306, 307, 309, 310, 311
See application file for complete search history.

(56) References Cited

U.S. PATENT DOCUMENTS

| | | |
|---|---|---|
| 2008/0149832 A1 | 6/2008 | Zorn |
| 2018/0100875 A1 | 4/2018 | Moheimani |

\* cited by examiner

SURFACE AFTER DEPASSIVATION

SURFACE BEFORE DEPASSIVATION

METHODS AND DEVICES CONFIGURED TO OPERATED SCANNING TUNNELING MICROSCOPES USING OUT-OF-BANDWIDTH FREQUENCY COMPONENTS ADDED TO BIAS VOLTAGE AND RELATED SOFTWARE

CLAIM FOR PRIORITY

The present application claims priority to U.S. patent application Ser. No. 17/089,214; titled Methods and Devices Configured to Operated Scanning Tunneling Microscopes using Out-Of-Bandwidth Frequency Components Added to Bias Voltage and Related Software filed in the U.S.P.T.O. on Nov. 4, 2020 which claims priority to U.S. Provisional Patent Application No. 62/930,383, titled System And Method For Measuring Capacitive Current In A Scanning Tunneling Microscope With Applications To Lithography And Imaging, filed in the U.S.P.T.O. on Nov. 4, 2019, the entire disclosures of which are hereby incorporated herein by reference.

STATEMENT OF GOVERNMENT SUPPORT

This invention was made with government support under Grant No. FA8650-15-C-7542 awarded by the Air Force Research Laboratory and Grant No. DE-EE0008322 awarded by the Department of Energy. The government has certain rights in the invention.

FIELD

The present invention relates in general to the field of lithography, and more particularly, to nanolithography.

BACKGROUND

Imaging at the atomic-scale level is achievable with the scanning tunneling microscope (STM), an instrument that operates based on the quantum mechanical phenomenon known as tunneling. Ultrahigh vacuum (UHV) STM can be employed to investigate chemical, physical, and structural properties as well as surface characteristics with atomic resolution. The STM include an extremely sharp tip, which is displaced within sub-nanometer distances from a conductive, or semiconductive, surface while a bias voltage is applied between them. By bringing the tip very close to the surface, electrons tunnel through the tip-sample gap. By feedback control of the tunnel current, the tip height over the sample can be maintained, and atomic-resolution imaging performed by moving the tip in a raster scan across the surface.

The STM can be used as a lithography tool to manipulate individual atoms at the nanoscale. Among various surfaces and materials that have been investigated for nanolithography, considerable research has been devoted to the hydrogen-passivated Si<100> surface. Researchers' interest in the de-passivation of individual hydrogen atoms on hydrogen-terminated silicon surfaces is due to their unique properties. The silicon substrate can be used to fabricate conventional silicon-based microelectronic devices, and the resist properties of hydrogen passivation on semiconductors may enable fabrication of next-generation electronic devices. Also, due to the reactivity and binding chemistries of silicon, hydrogen atoms can be selectively removed and replaced with specific atoms or molecules to achieve the desired properties.

Direct tip-sample interactions, current, and electric field have been used for STM lithography. Field-emitted or tunneling electrons from the STM tip are employed to bring about removal of hydrogen atoms from the hydrogen-terminated silicon surface. In the high-voltage (i.e., 6-10 V) regime, the electron's energy can exceed the threshold energy of the Si—H bond causing the removal of hydrogen atoms from the surface. The desorption yield can be constant in this regime and may be independent of current and voltage.

In the low-voltage regime, higher currents may be needed for de-passivation and the yield may be voltage and current dependent. There are some discrepancies in the literature regarding the desorption mechanism in the low-voltage regime. Despite the underlying de-passivation mechanism, resolutions down to the atomic level are achievable in low-voltage mode.

In some approaches, dangling bonds are created at specific sites (by removal of hydrogen atoms) that can be filled later by specific molecules or atoms. Upon the removal of a hydrogen atom from the hydrogen-terminated silicon surface, a sudden increase of tunneling current is observed due to the silicon's higher local density of states compared to the hydrogen. This jump in the tunneling current is compensated by the controller to maintain the current setpoint value, therefore, a desorption event can be evidenced by an increase in the topography. Based on this observation, a feedback-controlled lithography (FCL) method was developed to remove single hydrogen atoms by actively monitoring the topography signal and terminating the lithography process when a desorption event is detected.

While some nanopatterning lithography techniques use a positive sample bias voltage, it has been reported that hydrogen de-passivation occurs from hydrogen-terminated silicon surfaces at negative sample bias voltages. Compared to lithography at the positive sample bias voltages, significantly higher bias voltages (−4 V to −10 V) and tunneling currents (1 nA to 10 nA) are used at negative voltage scheme, which will ultimately affect the tip resolution. For example, the tunneling current used at the bias voltage of −4 V has been reported as approximately 10 nA. The tip is extremely close to the surface at such a bias and current combination, which ultimately increases the chance of a tip-sample crash.

SUMMARY

Disclosed herein is a novel method for the controlled removal of hydrogen atoms at negative sample bias voltages. Voltage-modulated feedback-controlled lithography (VMFCL) de-passivates selected hydrogen atoms at negative sample bias voltages using much lower current and voltage setpoints compared to previously reported values. The disclosed method enables a new instrument configuration wherein the tip-sample height is maintained at the normal imaging levels while simultaneously performing lithography. The instrument is greatly improved for lithography mode wherein the chance of a tip-sample crash is significantly decreased, and lithography precision is significantly increased.

Various embodiments of the present invention are disclosed herein. For example, in one embodiment, a lithography method for removing an atom from a surface is disclosed, based on detection of sharp changes in tip-sample relative height in an STM. The lithography method is based on operating a scanning tunneling microscope (STM), having an STM tip held near the surface by a control feedback loop, wherein the STM measures a relative height between the STM tip and the surface. Then a bias voltage is applied between the surface and the STM tip, wherein the DC component of the bias voltage is negative at the surface referenced to the STM tip. The method further comprises modulating the bias voltage with a dither voltage at a dither frequency and dither amplitude wherein the dither frequency is greater than the controller frequency bandwidth and less than the resonance frequency of the STM and measuring a tip-sample current between the STM tip and the surface. The method further comprises modifying the tip-sample current for control feedback by removing signals at the dither frequency and a number of harmonics of the dither frequency from the tip-sample current. The dither amplitude is then increased to effect a desorption of the atom from the surface.

In one set of embodiments, a desorption of an atom from the surface is detected as a sharp increase in the relative height, and upon detecting the sharp increase in the relative height, the dither amplitude is decreased. In another set of embodiments, a desorption of an atom from the surface is detected as a sharp increase in the tip-sample current, and upon detecting the sharp increase in the tip-sample current, the dither amplitude is decreased.

In another aspect of the invention, the atom is a hydrogen atom and the surface is hydrogen-terminated.

In one aspect of the present invention a set of notch filters in the control feedback loop are configured to remove the feedback signals at the dither frequency and the number of harmonics of the dither frequency from the tip-sample current. In another aspect, the number of harmonics removed is preferably at least five.

In other embodiments, the method further comprises the steps of selecting a desorption position from a set of desorption positions for desorption of an atom from the surface, moving the STM tip to the desorption position, increasing the dither amplitude while the STM tip is at the desorption position, comparing the relative height of the STM tip above the surface to a predefined threshold to detect a sharp change in relative height. Further to the method, if the sharp change in relative height is not detected then the dither amplitude is increased again and the comparing step repeated. If the sharp change in relative height is detected or if the dither amplitude has reached a maximum without any sharp change being detected, then the dither amplitude is decreased to a value near zero.

In yet other embodiments, the method comprises the steps of selecting a desorption position from a set of desorption positions for desorption of an atom from the surface, moving the STM tip to the desorption position, increasing the dither amplitude while the STM tip is at the desorption position, comparing the tip-sample current of the STM tip above the surface to a predefined threshold to detect a sharp change in tip-sample current. Further to the method, if the sharp change in tip-sample current is not detected then the dither amplitude is increased again and the comparing step repeated. If the sharp change in tip-sample is detected or if the dither amplitude has reached a maximum without any sharp change being detected, then the dither amplitude is decreased to a value near zero.

According to further embodiments of the present invention, the lithography method may be enhanced to perform imaging functions, by determining a measured capacitive current, a measured AC tunneling current and a measured DC tunneling current from the tip-sample current. The measured capacitive current is detected 90 degrees out of phase from the dither voltage and, the measured AC tunneling current is detected in phase with the dither voltage. In some embodiments, the step of determining a measured capacitive current and a measured tunneling current is performed using a lock-in amplifier. In other embodiments, the step of determining a measured capacitive current and a measured tunneling current is performed by using a Lyapunov filter. It is also taught that STM may be operated to de-passivate an atom from the surface while simultaneously collecting an STM scanned image comprising at least one of the measured capacitive current, the measured AC tunneling current or the measured DC tunneling current.

In another embodiment of the present invention, a lithography instrument for desorbing atoms from a surface is disclosed using a scanning tunneling microscope. The STM is configured such that the STM tip is held at a bias voltage with respect to the surface wherein the bias voltage is negative and, the STM control system is configured to measure a tip-sample current between the STM tip and the surface. The control system is further configured to operate a control feedback loop within a control frequency bandwidth which adjusts a relative height between the STM tip and the surface to maintain the amplitude of the tip-sample current within the control frequency bandwidth. The control system is further configured to modulate the bias voltage with a dither voltage at a dither frequency and dither amplitude wherein the dither frequency is greater than the control frequency bandwidth and less than the lowest resonance frequency of the STM. In another aspect of the control system, the tip-sample current is modified for control feedback by removing signals at the dither frequency and a number of harmonics of the dither frequency from the tip-sample current. The instrument is configured to detect a desorption of the atom from the surface and, upon detecting the desorption of the atom, decrease the dither amplitude.

In a further embodiment, to detect the desorption of the atom from the surface, the lithography instrument may be further configured to select a desorption position for desorption of the atom from the surface, move the STM tip parallel to the surface to the desorption position, increase the dither amplitude while the STM tip is at the desorption position and, compare the tip-sample current to a predefined threshold to detect a sharp change in tip-sample current as the desorption of the atom. If the sharp change in tip-sample current is not detected, then the dither amplitude is increased and the compare step repeated. If the sharp change in tip-sample current is detected or if the dither amplitude has reached a maximum without any sharp change being detected, then the dither amplitude is decreased to a value near zero.

In another embodiment, to detect the desorption of the atom from the surface, the lithography instrument is configured to select a desorption position for desorption of the atom from the surface, move the STM tip parallel to the surface to the desorption position, increase the dither amplitude while the STM tip is at the desorption position and, compare the relative height to a predefined threshold to detect a sharp change in relative height as the desorption of the atom. If the sharp change in relative height is not detected, then increase the dither amplitude again and repeat the compare step. If the sharp change in relative height is detected or if the dither amplitude has reached a maximum without any sharp change being detected, then decrease the dither amplitude to a value near zero.

In yet another embodiment of the lithography instrument, wherein it may be used a novel imaging mode, the control system is further configured to determine a measured capacitive current, a measured AC tunneling current and a measured DC tunneling current from the tip-sample current. The measured capacitive current is detected 90 degrees out of phase from the dither voltage and, the measured AC tunneling current is detected in phase with the dither voltage.

In one aspect, the lithography instrument may comprise a lock-in amplifier, wherein the measured capacitive current and the measured tunneling current are determined using the lock-in amplifier. In another aspect, the lithography instrument may comprise a Lyapunov filter, wherein the measured capacitive current and the measured tunneling current are determined using the Lyapunov filter.

It is conceived that the lithography instrument may be programmably configured to move the STM tip to one or more desorption positions above the surface and desorb one or more atoms from the surface at the one or more desorption positions. The lithography instrument may be configured to collect at least one scanned image comprising the measured capacitive current, the measured AC tunneling current and the measured DC tunneling current. The scanned image may be collected concurrently with desorbing the one or more atoms from the surface at the one or more desorption positions.

In another embodiment of the present invention, a modified scanning tunneling microscope is disclosed, the STM comprising an STM tip at a bias voltage with respect to the surface wherein the bias voltage is negative. The STM includes a control system, connected to a z-actuator and an x-y scanner, the control system configured to measure a tip-sample current between the STM tip and the surface; and further configured to operate a control feedback loop within a control frequency bandwidth. The control system then adjusts a relative height between the STM tip and the surface, with the z-actuator, to maintain the amplitude of the tip-sample current within the control frequency bandwidth. In another aspect, the control system is configured to modulate the bias voltage with a dither voltage at a dither frequency and dither amplitude wherein the dither frequency is greater than the control frequency bandwidth and less than the lowest resonance frequency of the STM. The control system is further configured to modify the tip-sample current for control feedback by removing signals at the dither frequency and a number of harmonics of the dither frequency from the tip-sample current. The control system is further configured to extract at least one of a measured capacitive current, a measured AC tunneling current or a measured DC tunneling current from the tip-sample current, wherein the measured capacitive current is 90 degrees out of phase from the dither voltage, and wherein the measured tunneling current is in phase with the dither voltage. The control system is further configured to scan the STM tip approximately parallel to the surface with the x-y scanner to a set of x-y scan positions and, determine at least one scanned image from the measured capacitive current, the measured AC tunneling current or the measured DC tunneling current.

In another embodiment, a method is disclosed for obtaining an I-V curve for a surface using the modified scanning tunneling microscope. The I-V curve method includes modifying a scanning tunneling microscope as described in the previous paragraph. Then during operation of the modified scanning tunneling microscope, while the dither voltage amplitude is changing, measuring the AC tunneling current I as a function of dither voltage amplitude V to form an I-V curve for each x-y position in the set of x-y scan positions, each x-y position corresponding to an image pixel in the scanned image.

In another aspect of the I-V curve method at least one of the bias voltage DC level, dither voltage amplitude or dither voltage frequency may be changed while measuring the tip-sample current.

According to the present invention, yet another method for performing lithography is disclosed based on modifying a scanning tunneling microscope as described previously, selecting a desorption position for desorption of an atom from the surface and moving the STM tip parallel to the surface to the desorption position. While the STM tip is at the desorption position; increasing the dither amplitude and comparing the relative height to a predefined threshold to detect a sharp change in relative height as the desorption of the atom. If the sharp change in relative height is not detected, the dither amplitude is increased again and the compare step repeated. If the sharp change in relative height is detected or if the dither amplitude has reached a maximum without any sharp change being detected, then the dither amplitude is decrease to a value near zero.

According to another aspect of the method for performing lithography, instead of detecting sharp changes in relative height of the tip to the sample, the tip-sample current is compared to a predefined threshold to detect a sharp change in the tip-sample current as the desorption of the atom. If the sharp change in tip-sample current is not detected, the dither amplitude is increased again, and the compare step repeated. If the sharp change in tip-sample is detected or if the dither amplitude has reached a maximum without any sharp change being detected, then the dither amplitude is decrease to a value near zero.

BRIEF DESCRIPTION OF THE DRAWINGS

The subject matter, which is regarded as the invention, is particularly pointed out and distinctly claimed in the claims at the conclusion of the specification. The foregoing and other objects, features, and advantages of the invention are apparent from the following detailed description taken in conjunction with the accompanying drawings.

DETAILED DESCRIPTION OF EMBODIMENTS ACCORDING TO THE INVENTION

Exemplary embodiments of the present disclosure are described in detail with reference to the accompanying drawings. The disclosure may, however, be exemplified in many different forms and should not be construed as being limited to the specific exemplary embodiments set forth herein. Rather, these exemplary embodiments are provided so that this disclosure will be thorough and complete, and will fully convey the scope of the disclosure to those skilled in the art.

As described herein in detail herein, in some embodiments according to the invention, a method of controlling removal of hydrogen atoms from a hydrogen-terminated silicon surface at negative sample bias voltages can be performed wherein voltage-modulated feedback-controlled lithography (VMFCL) de-passivates selected hydrogen atoms at negative sample bias voltages using much lower current and bias voltage setpoints compared to previously reported values.

Further, a new instrument configuration is shown wherein the tip-sample height is maintained at typical imaging levels while simultaneously performing lithography. In lithography mode of operation, the instrument is remarkably improved over prior art methods such that the chance of a tip-sample crash can be significantly decreased, and lithography precision may be significantly increased compared to other methods.

Figure 1:
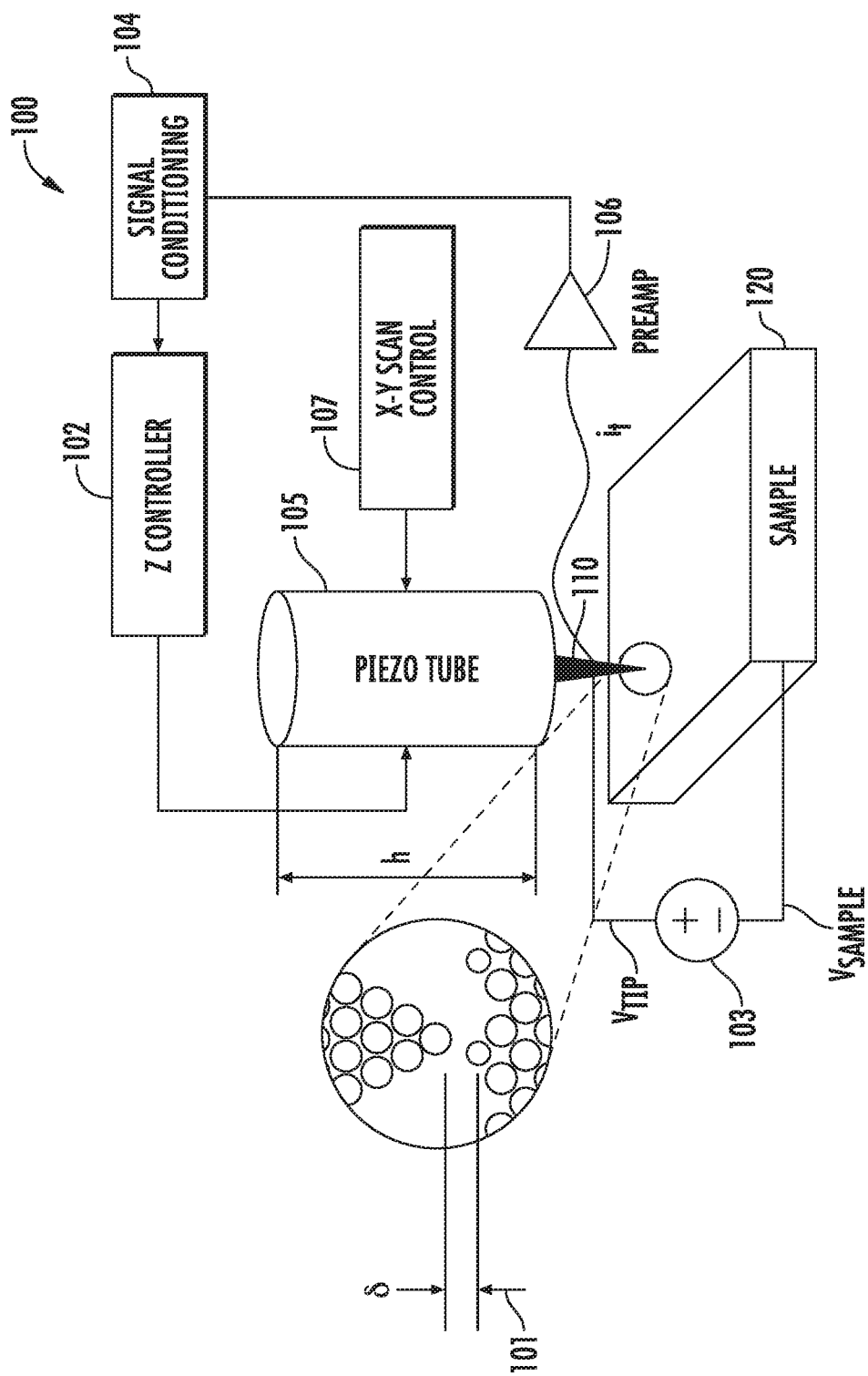
FIG. 1 is a schematic illustration of a scanning tunneling microscope (STM) operating in a constant current imaging mode wherein a sample to be imaged is negatively biased with respect to the STM tip.

FIG. 1 is a schematic illustration of a scanning tunneling microscope (STM) 100 operating in a constant current imaging mode wherein a sample to be imaged is negatively biased with respect to the STM tip. According to FIG. 1, the STM 100 operates in a constant current imaging mode and includes a Z-axis positioner 105, connected to an STM tip 110, and an X-Y scan control 107. Operation of the STM 100 is controlled by a control system that includes a Z-controller 102, a pre-amp 106 and other signal conditioning components 104. A model for the control system is described further in relation to FIG. 2. During operation of the STM 100, a bias voltage 103 is applied between an STM tip 110 and a sample 120. As the STM tip 110 moves over atoms on a sample 120, tunneling current $i_t$ is measured, where it changes responsive to variation in the height and atomic structure of the surface as the XY plane of the sample 120 is scanned by X-Y scan control 107. The measured tunneling current $i_t$ is provided as the feedback input signal for the control system, which commands the Z-axis positioner 105 to adjust a tip-sample height 101 (δ) to keep the tunneling current it at a predefined setpoint value $i_d$. The control system output is then translated to the vertical tip position h of the Z-axis positioner 105 and is plotted against the tip's XY position to construct a topographical image of the surface of the sample 120. In some embodiments according to the invention, the z-axis positioner is a piezoelectric element, which can be a tube-shaped structure.

Figure 2:
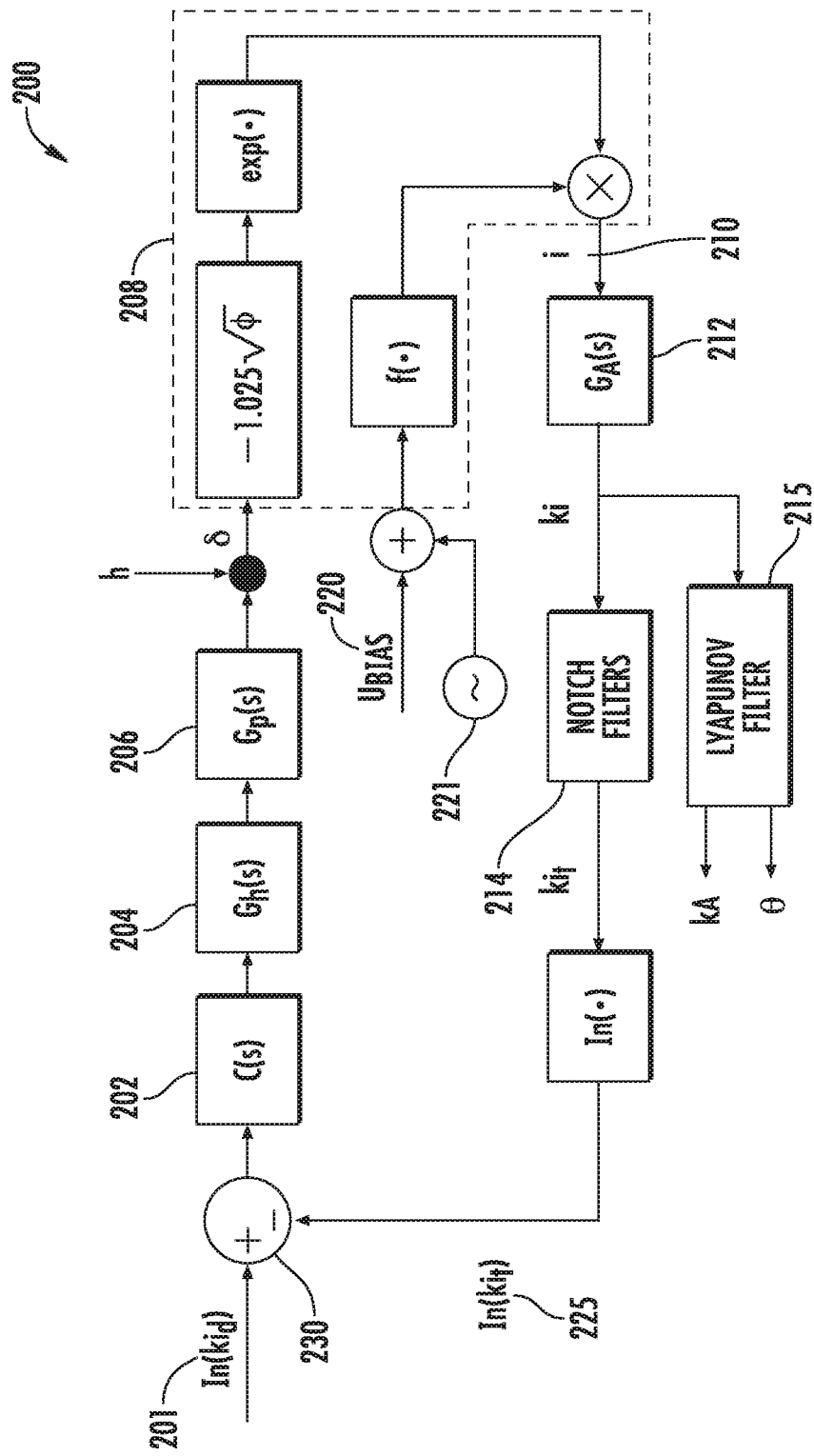
FIG. 2 is a block diagram of an STM Z-axis control system with simplified tunneling current model wherein $C(s)$, $G_h(s)$, and $G_p(s)$ refer to controller, high voltage amplifier, and Z axis actuator, respectively and $G_A(s)$ refers to preamplifier with the amplification gain of k in accordance with various embodiments of the present invention.

FIG. 2 is a block diagram of an STM Z-axis control system 200 for the STM 100 of FIG. 1, with simplified tunneling current model wherein $C(s)$, $G_h(s)$, and $G_p(s)$ refer to controller, high voltage amplifier, and Z axis actuator, respectively and $G_A(s)$ refers to preamplifier with the amplification gain of k in accordance with various embodiments of the present invention. According to FIG. 2, the control system 200 includes a z-controller 202, modeled as C(s), connected through a high voltage amplifier 204, modeled as Gh(s), to a Z-axis actuator, modeled as $G_p(s)$, resulting in a tip-sample current i (210), modeled by physical model 208 as described herein. A current preamplifier 212, modeled as $G_A(s)$ with the amplification gain of k, amplifies the tip-sample current i to obtain measured (amplified) current ki.

According to FIG. 2, a bias voltage 220 is combined with a dither voltage 221 to create the voltage that affects the tip-sample current i. In some embodiments according to the invention, the bias voltage can be a negative dc voltage (referenced to the sample) and the dither voltage can be an ac voltage signal having a frequency $\Omega$ so that the combined signal is an ramped amplitude modulated signal having the frequency $\Omega$. Measured (amplified) current, ki, is filtered by a set of notch filters 214 resulting in the measured (amplified) tunneling current $ki_t$, for which its associated natural logarithm, $\ln(ki_t)$ 225 is determined. The control system is configured to minimize the difference between the natural logarithm of a setpoint tunneling current, $\ln(ki_d)$ 201 and $\ln(ki_t)$ 225 at comparator 230. In some embodiments, a Lypanov filter 215 is included and its function is described in greater detail hereinbelow. It will be understood that the term "sample bias voltage" is defined as the sample potential measured with respect to the STM tip potential, ($V_{sample} - V_{tip}$) in some embodiments according to the invention.

For the physical model 208, the approximated expression for the tunneling current implies the dependence of electrical current on the tip-sample voltage difference in addition to its exponential dependence on the tip-sample gap. This approximated model can be expressed as:

$$i \approx \frac{4\pi e}{\hbar} e^{-1.025\sqrt{\phi}\delta} \rho_t(0) \int_{-ev}^{0} \rho_s(\varepsilon) d\varepsilon \quad (1)$$

where e is the electron charge, h is reduced Planck's constant, $\phi$ is the barrier height in electron volt, $\delta$ is approximately the gap between tip and sample in angstrom, $\rho_s$ and $\rho_t$ are density of states (DOS) of sample and tip respectively, and v is the tip-sample voltage difference. Eq. 1 can be written as:

$$i \approx f(v) e^{-1.025\sqrt{\phi\delta}} \quad (2)$$

where f(v) is:

$$f(v) = \frac{4\pi e}{\hbar} \rho_t(0) \int_{-ev}^{0} \rho_s(\varepsilon) d\varepsilon \quad (3)$$

As the tunneling current can have a small value, typically a few nano-amperes, a current preamplifier with the gain of k can be used to amplify the current and convert it to more measurable voltage.

To linearize the model, the natural logarithm of current is taken after it is amplified by the preamplifier. By taking the natural logarithm of current, we gain access to a variable that changes linearly with the tip-sample height. Thus, by regulating this variable we may regulate the tip-sample height, assuming that the remaining parameters are relatively constant.

In some embodiments according to the invention, a new approach is disclosed for performing Hydrogen de-passivation (HD) lithography based on the use of previously unused frequency bandwidth of conventional STM systems. During normal STM operation, only low frequency current measurements play a role in the construction of the surface topography image. Considering that the normal closed-loop bandwidth of STM is typically only a few hundred hertz, a large portion of the frequency band remains intact, which can be simultaneously used for other purposes without disturbing the normal operation of STM. In this new approach, HD lithography is performed with the voltage and current setpoint parameters conventionally used during the imaging mode, and the tip-sample gap is maintained at values normally used for imaging.

To perform HD lithography with negative sample bias voltage and at normal tip-sample height, a dither voltage, preferably a sinusoidal voltage with the frequency of $\Omega$, is added to the negative bias voltage. The effect of the dither voltage can be measured as a current with the frequency of $\Omega$ and its harmonics, as expected from Eq. 1. To minimally disturb the tip-sample height, the modulation signal of the dither voltage is selected such that the dither frequency is beyond the controller bandwidth. In addition, to avoid excitation of the scanner resonant dynamics, the dither frequency is selected to be lower than the resonance frequency of the scanner. To further ensure that the z-controller does not respond to the dither frequency, a set of notch filters are incorporated in the feedback loop attenuating the current at the frequency of $\Omega$ and its first few harmonics. Accordingly, in some embodiments according to the invention, the bias voltage, and consequently the tip-sample current, can be manipulated without substantially affecting the feedback controller. This ensures that the tip-sample height remains unchanged from a typical STM scan.

In some embodiments according to the invention, the dither voltage can be a waveform other than a simple sinusoidal waveform. It will be understood that in such embodiments, the frequency of the waveform used should be outside the frequency bandwidth of conventional STM systems. Further in such embodiments, the notch filters are configured to attenuate frequency components of the current signal ki with the frequency of $\Omega$ and its harmonics, as expected from Eq. 1 sufficiently so as to substantially leave the tip-sample height unaffected by operation of the feedback controller.

Upon de-passivation of a hydrogen atom, a jump in the tunneling current is observed which results from alterations in the local electronic structure of the surface. Electrons tunnel out of the silicon dangling bonds instead of the silicon-hydrogen bonds after a hydrogen atom leaves the surface resulting in a step change in the tunneling current. The controller then adjusts the relative tip-sample distance (height) to maintain the setpoint value of tunneling current. In normal imaging mode, then, a de-passivation event is detectable as a step jump in the height to which the z-positioner of the STM tip would normally actuate in closed loop operation.

Accordingly, as appreciated by the present inventors, the individual desorption events can be detected by monitoring for these step changes in the tunneling current (or in the closed loop height) so as to provide a removal routine for single hydrogen dimers from the silicon surface, which may be referred to herein as Voltage-Modulated Feedback-Controlled Lithography (VMFCL). In some embodiments, the removal routine may be automated. Moreover, this method can decrease the likelihood of a tip-sample crash and increase the lithography precision.

Figure 3:
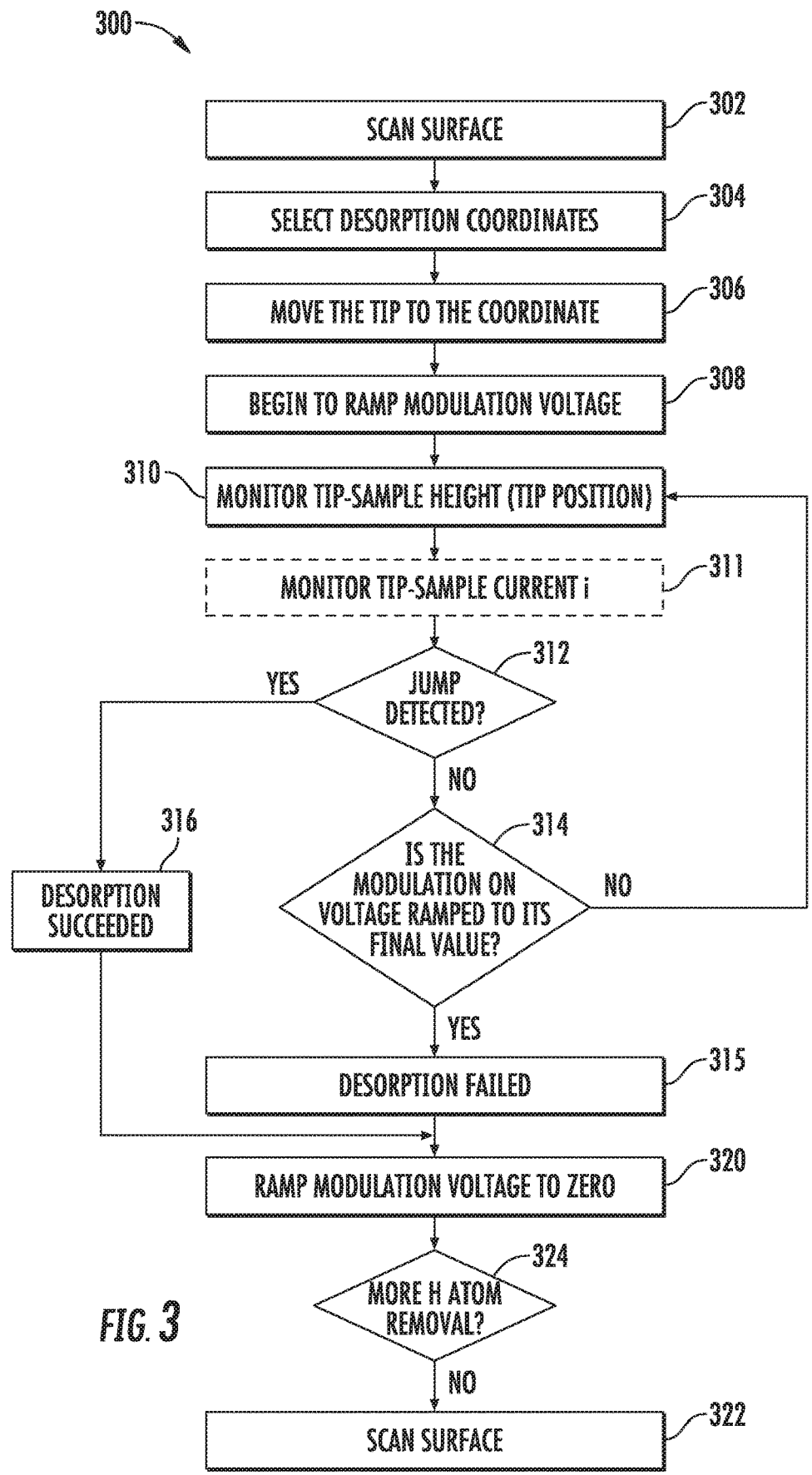
FIG. 3 is a flowchart illustrating methods of hydrogen removal using voltage-modulated feedback-controlled lithography (VMFCL) in accordance with various embodiments of the present invention.

FIG. 3 is a flowchart illustrating methods of hydrogen removal using voltage-modulated feedback-controlled lithography (VMFCL) in accordance with various embodiments of the present invention. According to FIG. 3, an automated hydrogen removal process 300 can use a high frequency dither voltage on a negative DC bias voltage while operating the STM in closed loop to control tunneling current. As shown in FIG. 3, at step 302, the surface of the sample is scanned, and the desired X-Y position is selected, from a set of X-Y positions, for hydrogen removal (step 304). At step 306, the tip is moved to the first X-Y position and, at step 308, a dither voltage of frequency Ω is added to a negative DC bias voltage of the sample and the amplitude of the combined signal is ramped up gradually to a final value, while relative height δ is monitored (step 310). The relative height is monitored to determine if a relative height threshold is crossed. Relative height threshold ($\delta_{th}$) is defined as a step change in the closed loop tip-sample height (z-actuator position) above which hydrogen is considered to have been removed from the surface. Relative height threshold $\delta_{th}$ should be carefully evaluated and selected because using a large threshold may increase the possibility of a missed desorption event whereas using a threshold that is too low may lead to false detection of a desorption event. See for example, FIG. 7 where a positive step change of about 0.05 nm in relative height, Z(nm), in some embodiments according to the invention, may be typical for a de-passivation event and $\delta_{th}$ selected in the range of about 0.02 to about 0.04 would be appropriate.

If, at step 312, a step change in the relative height above $\delta_{th}$ is detected (desorption succeeded 316) and the dither voltage is reduced to zero (step 320) and a determination is made as to whether any other hydrogen atoms are to be removed (step 324) so that the tip can be moved to the next X-Y position (step 306). If, however, at step 312, a step change in the relative height above $\delta_{th}$ is not detected, a determination is made as to whether the dither voltage amplitude has reached a maximum value (step 314). If, at step 314, the dither voltage has not yet ramped to the maximum value, then the dither voltage continues to ramp and the relative height is further monitored (step 310). If, at step 314, the dither voltage has been ramped to the maximum value but no step change in the relative height above $\delta_{th}$ has been detected then desorption failed (step 315), the dither voltage is reduced to zero (step 320). From the surface scan in step 302, the next X-Y position for hydrogen desorption is selected (step 324) and the process repeats at step 306. If there are no more positions for hydrogen removal then, optionally, an STM image may be scanned and recorded at step 322.

As further shown in FIG. 3, in some embodiments according to the invention, the tip-sample current be monitored (step 311) to determine if a current threshold is crossed. Current threshold ($i_{th}$) can be defined as a step change in the tip-sample current above which hydrogen is considered to have been removed from the surface. Tip-sample current threshold should be carefully evaluated and selected because using a large threshold increases the possibility to miss a desorption event and using a small threshold may lead to false detection. See for example FIG. 5 and FIG. 8, where an appropriate threshold current may be about 1.5 nA or about 0.5 nA above the mean current of about 1 nA (see also FIG. 9). In this embodiment, if, at step 312, a step change in the tip-sample current above $i_{th}$ is detected (desorption succeeded step 316) or the dither voltage amplitude has reached a maximum value (step 314, desorption failed step 315), the dither voltage is ramped down to zero (step 320). If, at step 314, the dither voltage has not been ramped to the maximum value, then the dither voltage ramp continues, and the tip-sample current is further monitored (step 311).

It will be further understood that, in some embodiments according to the invention, the process shown in FIG. 3 can be carried out by establishing a modulation voltage level that is sufficient to cause a desorption of a particular atom that terminates the surface of the sample. In some embodiments, the modulation voltage level can be determined either deterministically or empirically. Once determined, the lithography of FIG. 3 may be performed without a need to determine whether desorption has occurred before moving to the next location. Further, in some embodiments, the process may be performed by ramping the modulation voltage level directly to the level determined to be sufficient for desorption. In some embodiments according to the invention, the process may be performed without ramping the modulation voltage level, but rather by setting the modulation voltage level directly to the level determined to be sufficient for desorption.

The embodiments of the present VMFCL method should not be construed as limited to the de-passivation of hydrogen atoms from silicon surfaces. For example, in some embodiments, VMFCL may be used to de-passivate chlorine-terminated silicon surfaces, surfaces passivated with a different species of atoms, hydrogen-terminated diamond or germanium surfaces. Other passivated surfaces may also be processed using VMFCL in some embodiments according to the invention.

In still further embodiments according to the present invention, as appreciated by the present inventors, a capacitive current can be generated by adding the high-frequency dither voltage to the bias voltage. The generated capacitive current can be added to the tunneling current to form the tip-sample current i (same as i from FIG. 2). With the dither voltage added to the bias voltage, the tip-sample current i has an AC component and a DC component. By using a lock-in amplifier or a Lyapunov filter, the AC components (the capacitive current (AC by nature) and the AC tunneling current) and the DC components (the DC tunneling current) are separated and measured individually. Separation of these two types of current enables extraction of useful information from each of them. For example, the capacitive current can be used to produce capacitive images or it could be used to enable fast pre-approach of the STM tip. The AC tunneling current can be used to obtain an I-V map concurrently with the imaging. Furthermore, the capacitive current may be used to detect buried structures beneath the surface. Moreover, either the AC tunnel current, or the capacitive current, or a combination of both can be used for feedback control as an alternative to the low frequency tunnel current.

The total sample bias voltage can be written as:

$$v = v_{bias} + v_d \sin(\Omega t) \quad (5)$$

where $v_{bias}$ is the DC sample bias voltage and $v_d$ is the amplitude of dither voltage. The capacitive current can be obtained as:

$$i_{cap} = C\frac{dv}{dt} = Cv_d\Omega\cos(\Omega t) \quad (6)$$

where C is the total capacitance including the tip-sample capacitance and stray capacitances. While the tip-sample capacitance varies with tip-sample height, the stray capacitance typically has a constant value. The measured current is the sum of both the tunneling current ($i_{tun}$) and capacitive current ($i_{cap}$). Since tunneling current is in-phase with the dither voltage and the capacitive current is 90 degrees out of phase with the dither voltage, the tip-sample current can be expressed as:

$$i = i_{tun} + i_{cap} \quad (7)$$

$$= a_0 + \sum_{n=1}^{\infty} a_n \sin(n\Omega t) + Cv_d\Omega\cos(\Omega t)$$

$$= a_0 + A\sin(\Omega t + \theta) + \sum_{n=2}^{\infty} a_n \sin(n\Omega t)$$

where $$A = \sqrt{a_1^2 + (Cv_d\Omega)^2} \quad (8)$$

$$\theta = \arctan(Cv_d\Omega/a_1) \quad (9)$$

For capacitive imaging with an STM, the tip-sample current is first passed through a preamplifier with the known amplification gain of k and then passed through the Lyapunov filter 215, as shown in FIG. 2. Assuming that the modulation frequency of the dither voltage is well below the bandwidth of the preamplifier, kA and θ can be obtained by the Lyapunov filter, from which $\alpha_1$ and C are calculated as:

$$a_1 = A\cos(\theta) \quad (10)$$

$$C = \frac{A\sin(\theta)}{v_d\Omega} \quad (11)$$

and then the tunneling current can be extracted as:

$$i_{tun} = i - i_{cap} = i - A\sin(\theta)\cos(\Omega t) \quad (12)$$

Similarly, a lock-in amplifier may be used to extract an AC in-phase component of measured current (AC tunneling current), AC out-of-phase component (capacitive current) and a DC component (normal low-frequency DC tunneling current).

By this method, a capacitive current image, AC tunneling current image and a normal DC tunneling image can all be extracted from an STM scan and used for analysis of the sample surface.

In another embodiment of the present invention, known as I-V mapping, the AC tunneling current is recorded as a function of dither voltage at any given X-Y position during the STM scan.

In another embodiment, the STM scan may be stopped at any given X-Y position and taken out of closed-loop operation wherein the z-controller is turned off. With the tip-sample distance held to a constant, the bias voltage (DC level) is changed. While the bias voltage is changed, the tip-sample current is recorded as a function of bias voltage. In other embodiments, at least one of the bias voltage DC level, dither voltage amplitude or dither voltage frequency is changed while recording the tip-sample current to investigate the physical properties of the sample surface.

Experiments were performed at the room temperature with an UHV STM having the base pressure as low as $10^{-11}$ Torr. A 20-bit digital signal processor (DSP) with the sampling frequency of 100 kHz, commercially known as ZyVector, was used for control purposes. The scanner resonance frequency is located approximately at 2750 Hz. To prepare the H-terminated Si(100) wafer, a 4×8 mm² piece of boron-doped wafer was cut, and cleaned ex-situ using a standard Piranha etch to remove surface contaminants. The sample was then mounted into the sample holder and placed into the vacuum system. After the introduction to UHV, the sample was degassed at 650° C. for 8 hours and then was flashed to 1250° C. for 30 s to remove the surface oxide film and any surface carbon contamination. This flashing was repeated 3 times, and then the surface was cooled to 350° C. To saturate the surface with H atoms, the clean Si(100) surface was exposed to a flux of atomic H from a 1300° C. tungsten filament for 4 minutes, while it was maintained at 350° C. The sample was then cooled to room temperature and transferred into the STM chamber.

Figure 4:
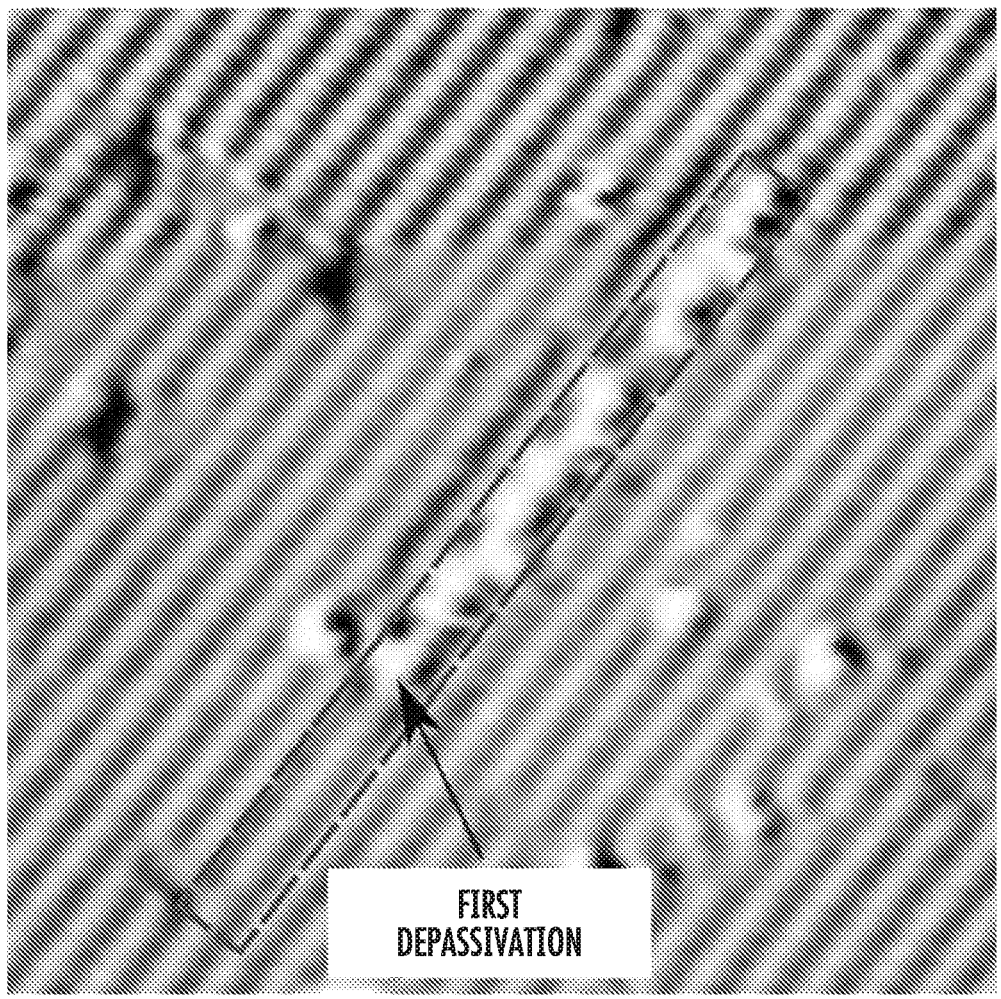
FIG. 4 is a topographical image of a surface after the performance of lithography highlighted in the rectangular area, the tip speed, bias voltage, and setpoint current were 0.1 nm/sec, −2.5 V, and 1 nA, respectively, the ac voltage amplitude is increased from 0 V to 1.5 V during the first half of the path and then remains constant at 1.5 V, in some embodiments according to the present invention.
Figure 5:
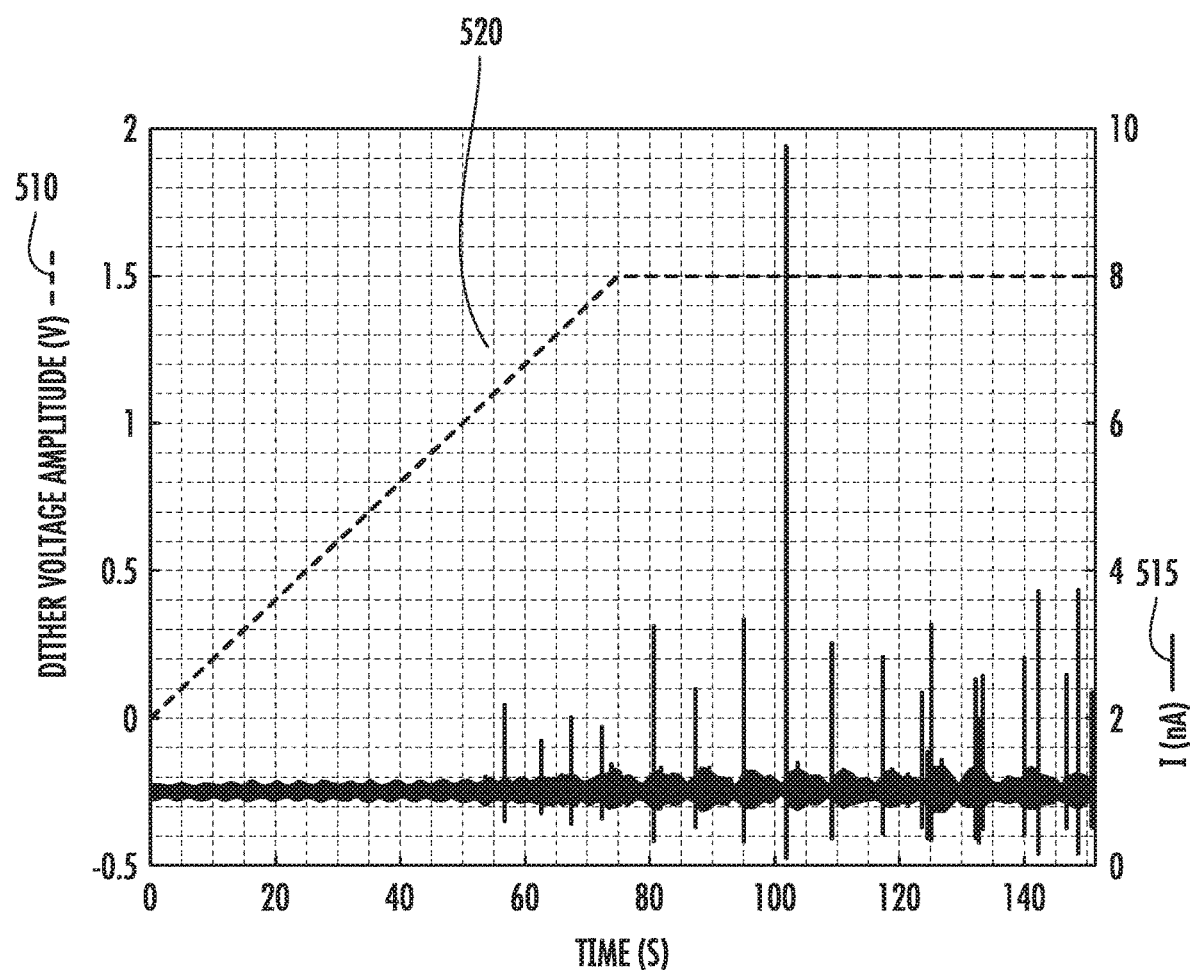
FIG. 5 is an example graph of ac voltage amplitude and current during a scan where the ac voltage amplitude is shown on the left axis and the current after the notch filters is shown on the right axis and the first de-passivation, which corresponds to the first jump in the current, occurs after about 56.7 seconds in some embodiments according to the present invention.

To examine the effect of modulation voltage amplitude on hydrogen de-passivation, the STM tip was moved along a dimer row with the speed of 0.1 nm/sec. The sample voltage was −2.5 V plus the modulated voltage. The controller was in the loop and adjusted the tip-sample height to maintain a 1 nA tunneling current. The closed-loop bandwidth of the STM was approximately 200 Hz. The modulation frequency was selected as 1 kHz (i.e., greater than the closed-loop bandwidth and lower than the first resonant frequency of the scanner). Five notch filters with notch frequencies of 1 kHz, 2 kHz, 3 kHz, 4 kHz, and 5 kHz were incorporated into the feedback loop to attenuate the effect of AC voltage on the measured current. Consequently, the controller output should not be affected by the modulation signal nor its harmonics. This ensures the feedback loop operates under imaging conditions. The amplitude of modulation was increased from 0 V to 1.5 V during the first 75 seconds and then kept constant at 1.5 V. Therefore, considering the −2.5 V bias voltage, the actual sample voltage varied from −4 V to −1 V when the modulation voltage ramps to its final value. FIG. 4 shows an image of the resulting topography after the lithography was performed. The tip trajectory along the dimer row is shown with in the highlighted area. The first de-passivation occurred when the tip has moved about 5.7 nm along the dimer row. At this point, the amplitude of modulation voltage had reached 1.15 V, which means that the sample voltage was fluctuating between −3.65 to −1.35 volts. FIG. 5 shows the modulation voltage amplitude 510 and the current 515 after filtering by the notch filters 215 as the tip moves along the dimer row. Frequent subsequent de-passivations occurred along the tip's path after the first de-passivation, which is evident in FIGS. 4 and 5, showing that the modulation voltage amplitude has reached the necessary threshold needed for the de-passivation.

Figure 6B:
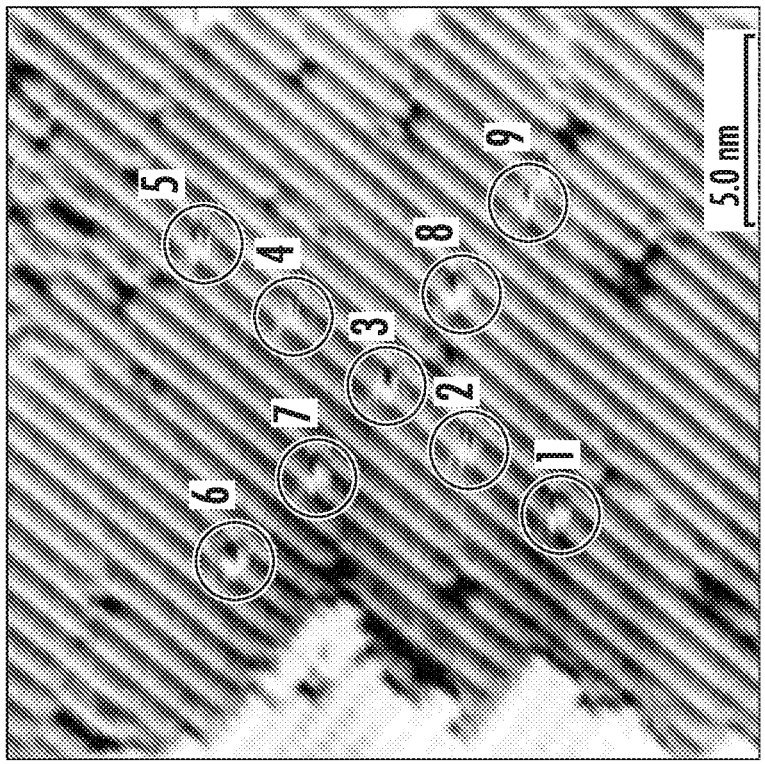
FIGS. 6A-B are topographical images for a surface prior to de-passivation and after de-passivation, respectively, showing removal of hydrogen atoms from the hydrogen terminated silicon surface where the bias voltage and the current setpoints are −2.5 V and 1 nA, respectively in some embodiments according to the present invention.
Figure 6A:
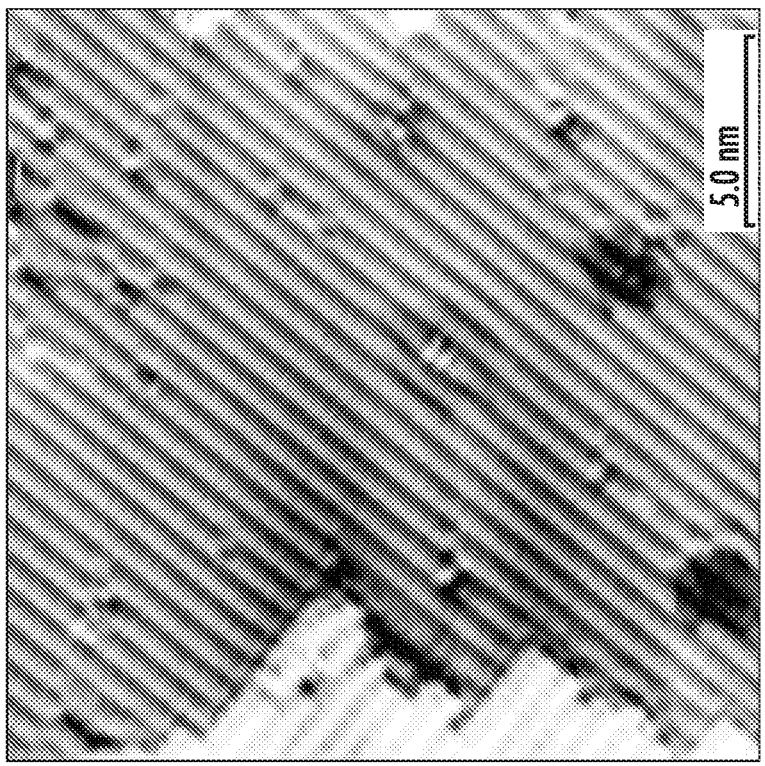

FIGS. 6A and 6B show before and after de-passivation using the VMFCL method described herein in some embodiments according to the present invention. FIG. 6B shows single hydrogens removal from the hydrogen-terminated silicon where the sample bias voltage was set to −2.5 V and the feedback loop maintains the DC tunneling current at 1 nA. Once the tip reaches a desired position, a 1 kHz modulation voltage was added to the setpoint bias voltage whose amplitude ramps up from zero to 1.5 V over 10 seconds. As de-passivation was detected or the modulation amplitude reached its maximum value, the modulation amplitude ramped down to zero in 0.1 seconds. The height signal was averaged for 20 ms before being compared with the height threshold (δth), which increased the accuracy of jump detection by reducing the noise of the height signal. The threshold for a jump to be considered a successful desorption event was set to 0.3 Ångstrom. As shown in FIG. 6, each of the targeted hydrogen atoms were removed from the surface.

Figure 7:
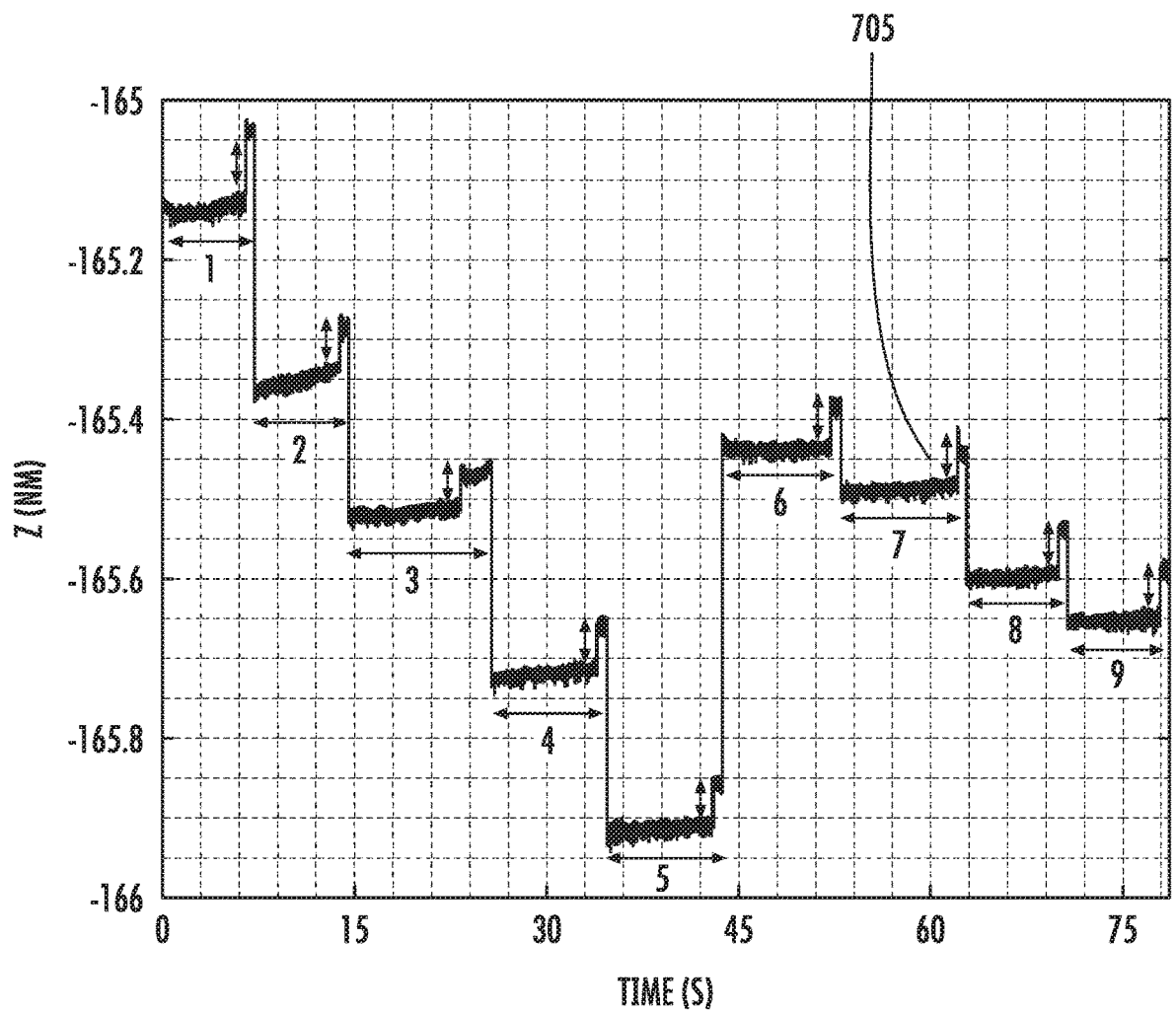
FIG. 7 is a graph showing Z positioner displacement as a function of time where each of the horizontal numbered arrows indicates the positioning of the tip above a specific dimer on the surface and desorption events are identified by the highlighted step jumps shown with vertical arrows in some embodiments according to the present invention.

The displacement of the Z positioner is also shown in FIG. 7 in which de-passivation events are shown at each arrow 705, wherein the current increased as soon as a hydrogen atom was desorbed from the surface and the controller moved the tip further away from the sample to maintain the setpoint current. This step in height, detected as a step jump in displacement of the Z-positioner while in closed loop feedback control, can be used to detect the desorption event.

Figure 8:
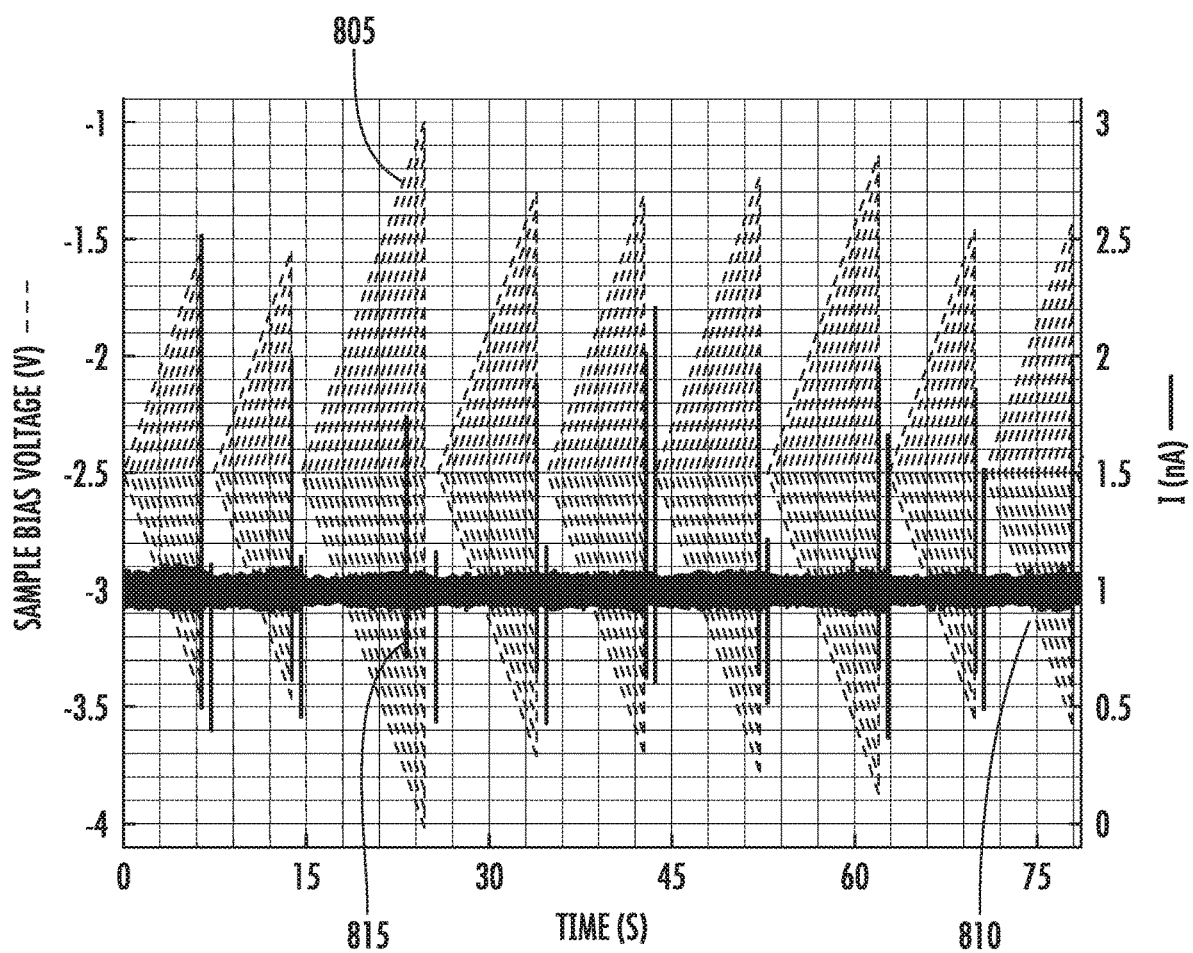
FIG. 8 is a graph of sample bias voltage and filtered current as a function of time where the left-hand axis is the bias voltage (shown as the triangular waveforms that include the modulated voltage signal) and the right-hand axis is the current (shown as the step waveforms) and hydrogen removal is indicated as a step change in current and the modulation bias voltage is reduced to zero and the tip is moved to the next coordinate once a hydrogen removal event is detected in some embodiments according to the present invention.

The current after application of the notch filters 215 and the sample bias voltage are shown in FIG. 8. According to FIG. 8, all de-passivation events were successfully identified except for the A, which is indicated by the continued ramp 805 of the dither voltage added to the sample bias voltage despite the current step 815. In all other cases, the corresponding ramp-up of the dither voltage is stopped after the current step, and returned to zero. In particular, the amplitude of dither voltage ramps down to zero as soon as the hydrogen atom is desorbed from the surface and the tip is moved to the next coordinate, where another step appears in the current and height. This jump is not related to hydrogen de-passivation. As shown in FIG. 8, the hydrogen atom desorbs from the surface when the amplitude of the dither voltage has a value in the range of 1 to 1.5 volts.

Figure 9:
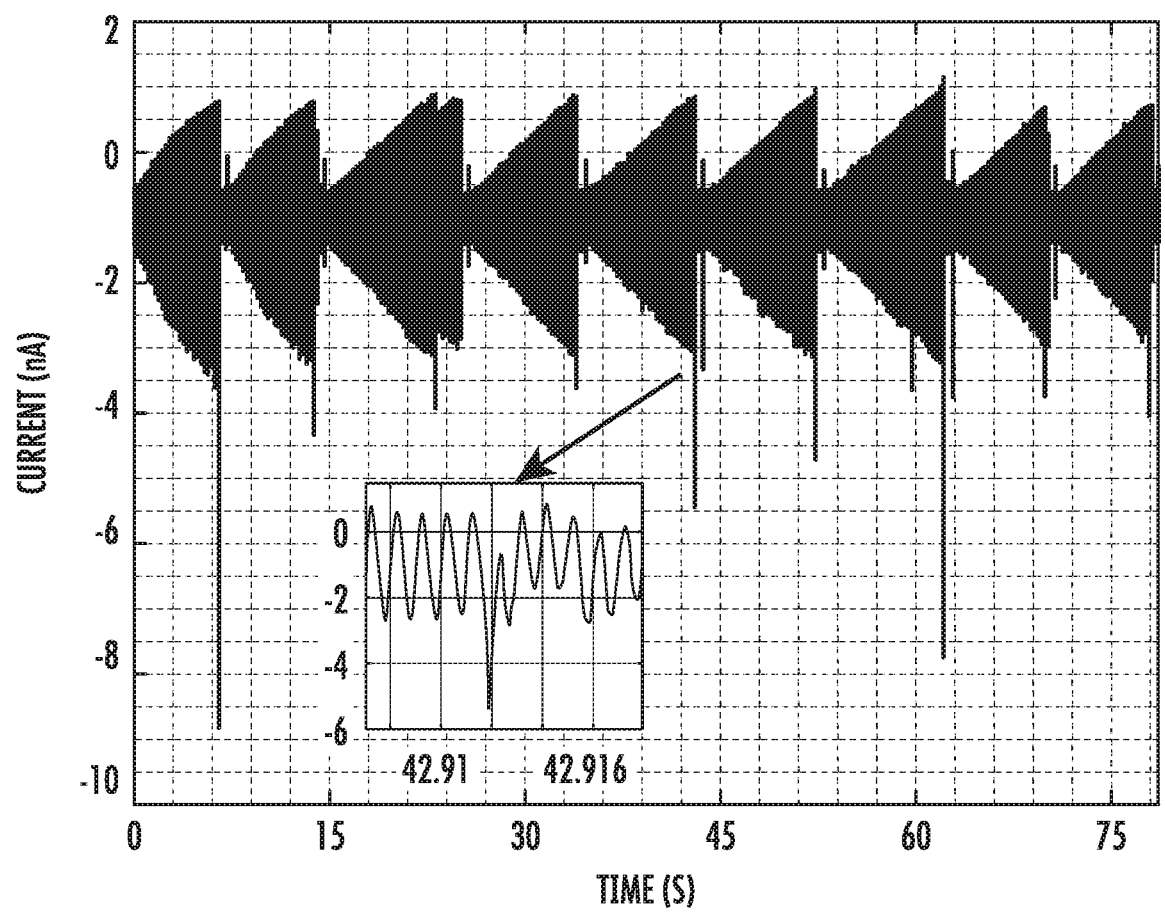
FIG. 9 is a graph of measured current before being filtered by the notch filters, where the current includes capacitive and tunneling components and the inset shows a detailed view of a desorption event as evidenced by the current in some embodiments according to the present invention.

The measured tip-sample current before the notch filters is also shown in FIG. 9. As described herein, adding modulation to the sample bias voltage induces oscillations with the same frequency in the tip-sample current, which are not visible in the figure because the respective period is relatively short given the scale of X-axis. The inset of FIG. 9 is a magnified view showing a de-passivation event. Current oscillations due to the application of a modulated voltage and the current jump resulted from hydrogen atom removal are clearly visible in the inset. The measured tip-sample current includes a high frequency capacitive current, a DC tunneling current, and an AC tunneling current, as described herein.

As appreciate by the present inventors, in some embodiments according to the present invention, by adding a high-frequency dither voltage to the DC setpoint (e.g., negative dc bias voltage), a new method for STM-based de-passivation lithography can be provided at room temperature. This method can be implemented on most conventional scanning tunneling microscope systems with a small modification to, for example, the STM control software. As described herein, lithography was performed on H-terminated Si at a negative sample bias voltage while maintaining a standard tip-sample distance used for imaging conditions. This can potentially increase the tip's lifetime.

As further described herein, in some embodiments according to the present invention, an automated process is described to extract single hydrogen atoms from the Si surface. The lithography precision and throughput were improved by continuously monitoring the tip-sample distance and stopping the process immediately after a de-passivation was detected. In some embodiments according to the present invention, this process was used to successfully create dangling bond structures by selectively removing H atoms at predefined locations. Precise removal of hydrogen atoms may enable fabrication of devices with atomically precise features, e.g. creation of identical qubits for quantum computation. The throughput of this method may also be improved by an implementation of parallel STMs according to embodiments of the present invention, thereby bringing the next-generation electronics into existence. The method may also be used to perform lithography on chlorine-terminated silicon surfaces, hydrogen-terminated diamond of germanium or other semiconductors, or other surfaces passivated with a different species of atoms.

Figure 10:
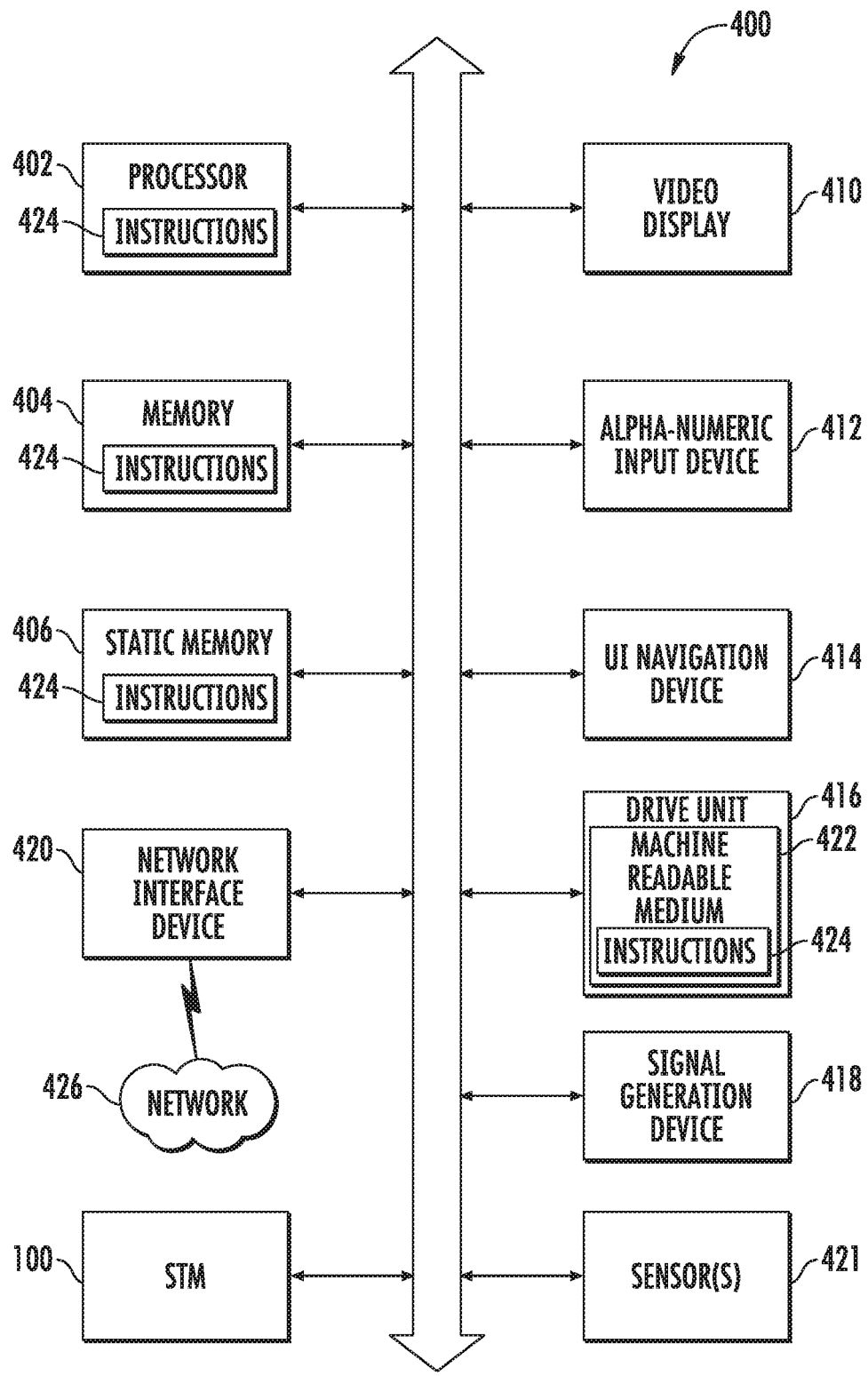
FIG. 10 is a block diagram of a computing system that can be used to perform processor-executable instructions represented by non-transitory processor-readable media to carry out the operations shown in, for example, FIGS. 2-9 and described in the associated materials of this disclosure in some embodiments according to the invention.

FIG. 10 is a block diagram of a computing system 400 that can be used to perform processor-executable instructions represented by non-transitory processor-readable media to carry out the operations shown in, for example, FIGS. 2-9 and described in the associated materials of this disclosure in some embodiments according to the invention. An aspect of an embodiment of the present invention includes, but not limited thereto, a system, method, and computer readable medium that provides for controlling an STM to perform lithography and/or imaging using a dc bias voltage modulated with a dithering signal as described herein. In particular, in some embodiments according to the invention, the system 400 can be operatively coupled to the STM 100 so that, for example, the dither voltage signal can be generated and combined with the dc bias voltage for application between the tip and the sample. Further the system 400 can operate to receive the time varying current signal and operate thereon to extract the current components used for control of the piezo tube 105, the z controller 102, and the X-Y scan control 107. Still further the system 400 can perform the filtering (notch and Lyapunov) used to insulate the STM control system from adverse effects of the frequency components of the time varying current signal generated by the dither voltage signal (including harmonics). Accordingly, the structure illustrated in FIG. 10 can be used to perform processor executable instructions to carry out the operations described herein.

Examples of system 400 can include logic, one or more components, circuits (e.g., modules), or mechanisms. Circuits are tangible entities configured to perform certain operations. In an example, circuits can be arranged (e.g., internally or with respect to external entities such as other circuits) in a specified manner. In an example, one or more computer systems (e.g., a standalone, client or server computer system) or one or more hardware processors (processors) can be configured by software (e.g., instructions, an application portion, or an application) as a circuit that operates to perform certain operations as described herein. In an example, the software can reside (1) on a non-transitory machine readable medium or (2) in a transmission signal. In an example, the software, when executed by the underlying hardware of the circuit, causes the circuit to perform the certain operations.

In an example, a circuit can be implemented mechanically or electronically. For example, a circuit can comprise dedicated circuitry or logic that is specifically configured to perform one or more techniques such as discussed above, such as including a special-purpose processor, a field programmable gate array (FPGA) or an application-specific integrated circuit (ASIC). In an example, a circuit can comprise programmable logic (e.g., circuitry, as encompassed within a general-purpose processor or other programmable processor) that can be temporarily configured (e.g., by software) to perform the certain operations. It will be appreciated that the decision to implement a circuit mechanically (e.g., in dedicated and permanently configured circuitry), or in temporarily configured circuitry (e.g., configured by software) can be driven by cost and time considerations.

Accordingly, the term "circuit" is understood to encompass a tangible entity, be that an entity that is physically constructed, permanently configured (e.g., hardwired), or temporarily (e.g., transitorily) configured (e.g., programmed) to operate in a specified manner or to perform specified operations. In an example, given a plurality of temporarily configured circuits, each of the circuits need not be configured or instantiated at any one instance in time. For example, where the circuits comprise a general-purpose processor configured via software, the general-purpose processor can be configured as respective different circuits at different times. Software can accordingly configure a processor, for example, to constitute a particular circuit at one instance of time and to constitute a different circuit at a different instance of time.

In an example, circuits can provide information to, and receive information from, other circuits. In this example, the circuits can be regarded as being communicatively coupled to one or more other circuits. Where multiple of such circuits exist contemporaneously, communications can be achieved through signal transmission (e.g., over appropriate circuits and buses) that connect the circuits. In embodiments in which multiple circuits are configured or instantiated at different times, communications between such circuits can be achieved, for example, through the storage and retrieval of information in memory structures to which the multiple circuits have access. For example, one circuit can perform an operation and store the output of that operation in a memory device to which it is communicatively coupled. A further circuit can then, at a later time, access the memory device to retrieve and process the stored output. In an example, circuits can be configured to initiate or receive communications with input or output devices and can operate on a resource (e.g., a collection of information).

The various operations of method examples described herein can be performed, at least partially, by one or more processors that are temporarily configured (e.g., by software) or permanently configured to perform the relevant operations. Whether temporarily or permanently configured, such processors can constitute processor-implemented circuits that operate to perform one or more operations or functions. In an example, the circuits referred to herein can comprise processor-implemented circuits.

Similarly, the methods described herein can be at least partially processor-implemented. For example, at least some of the operations of a method can be performed by one or processors or processor-implemented circuits. The performance of certain of the operations can be distributed among the one or more processors, not only residing within a single machine, but deployed across a number of machines. In an example, the processor or processors can be located in a single location (e.g., within a home environment, an office environment or as a server farm), while in other examples the processors can be distributed across a number of locations.

Example embodiments (e.g., apparatus, systems, or methods) can be implemented in digital electronic circuitry, in computer hardware, in firmware, in software, or in any combination thereof. Example embodiments can be implemented using a computer program product (e.g., a computer program, tangibly embodied in an information carrier or in a machine readable medium, for execution by, or to control the operation of, data processing apparatus such as a programmable processor, a computer, or multiple computers).

A computer program can be written in any form of programming language, including compiled or interpreted languages, and it can be deployed in any form, including as a stand-alone program or as a software module, subroutine, or other unit suitable for use in a computing environment. A computer program can be deployed to be executed on one computer or on multiple computers at one site or distributed across multiple sites and interconnected by a communication network.

In an example, operations can be performed by one or more programmable processors executing a computer program to perform functions by operating on input data and generating output. Examples of method operations can also be performed by, and example apparatus can be implemented as, special purpose logic circuitry (e.g., a field programmable gate array (FPGA) or an application-specific integrated circuit (ASIC)).

The computing system can include clients and servers. A client and server are generally remote from each other and generally interact through a communication network. The relationship of client and server arises by virtue of computer programs running on the respective computers and having a client-server relationship to each other. In embodiments deploying a programmable computing system, it will be appreciated that both hardware and software architectures require consideration. Specifically, it will be appreciated that the choice of whether to implement certain functionality in permanently configured hardware (e.g., an ASIC), in temporarily configured hardware (e.g., a combination of software and a programmable processor), or a combination of permanently and temporarily configured hardware can be a design choice. Below are set out hardware (e.g., machine 400) and software architectures that can be deployed in example embodiments.

In a networked deployment, the machine 400 can operate in the capacity of either a server or a client machine in server-client network environments. In an example, machine 400 can act as a peer machine in peer-to-peer (or other distributed) network environments. The machine 400 can be a personal computer (PC), a tablet PC, a set-top box (STB), a Personal Digital Assistant (PDA), a mobile telephone, a web appliance, a network router, switch or bridge, or any machine capable of executing instructions (sequential or otherwise) specifying actions to be taken (e.g., performed) by the machine 400. Further, while only a single machine 400 is illustrated, the term "machine" shall also be taken to include any collection of machines that individually or jointly execute a set (or multiple sets) of instructions to perform any one or more of the methodologies discussed herein.

Example machine (e.g., computer system) 400 can include a processor 402 (e.g., a central processing unit (CPU), a graphics processing unit (GPU) or both), a main memory 404 and a static memory 406, some or all of which can communicate with each other via a bus 408. The machine 400 can further include a display unit 410, an alphanumeric input device 412 (e.g., a keyboard), and a user interface (UI) navigation device 411 (e.g., a mouse). In an example, the display unit 810, input device 417 and UI navigation device 414 can be a touch screen display. The machine 400 can additionally include a storage device (e.g., drive unit) 416, a signal generation device 418 (e.g., a speaker), a network interface device 420, and one or more sensors 421, such as a global positioning system (GPS) sensor, compass, accelerometer, or other sensor.

The storage device 416 can include a machine readable medium 422 on which is stored one or more sets of data structures or instructions 424 (e.g., software) embodying or utilized by any one or more of the methodologies or functions described herein. The instructions 424 can also reside, completely or at least partially, within the main memory 404, within static memory 406, or within the processor 402 during execution thereof by the machine 400. In an example, one or any combination of the processor 402, the main memory 404, the static memory 406, or the storage device 416 can constitute machine readable media.

While the machine readable medium 422 is illustrated as a single medium, the term "machine readable medium" can include a single medium or multiple media (e.g., a centralized or distributed database, and/or associated caches and servers) that configured to store the one or more instructions 424. The term "machine readable medium" can also be taken to include any tangible medium that is capable of storing, encoding, or carrying instructions for execution by the machine and that cause the machine to perform any one or more of the methodologies of the present disclosure or that is capable of storing, encoding or carrying data structures utilized by or associated with such instructions. The term "machine readable medium" can accordingly be taken to include, but not be limited to, solid-state memories, and optical and magnetic media. Specific examples of machine readable media can include non-volatile memory, including, by way of example, semiconductor memory devices (e.g., Electrically Programmable Read-Only Memory (EPROM), Electrically Erasable Programmable Read-Only Memory (EEPROM)) and flash memory devices; magnetic disks such as internal hard disks and removable disks; magneto-optical disks; and CD-ROM and DVD-ROM disks.

The instructions 424 can further be transmitted or received over a communications network 426 using a transmission medium via the network interface device 420 utilizing any one of a number of transfer protocols (e.g., frame relay, IP, TCP, UDP, HTTP, etc.). Example communication networks can include a local area network (LAN), a wide area network (WAN), a packet data network (e.g., the Internet), mobile telephone networks (e.g., cellular networks), Plain Old Telephone (POTS) networks, and wireless data networks (e.g., IEEE 802.11 standards family known as Wi-Fi®, IEEE 802.16 standards family known as WiMax®), peer-to-peer (P2P) networks, among others. The term "transmission medium" shall be taken to include any intangible medium that is capable of storing, encoding or carrying instructions for execution by the machine, and includes digital or analog communications signals or other intangible medium to facilitate communication of such software.

Figure 11A:
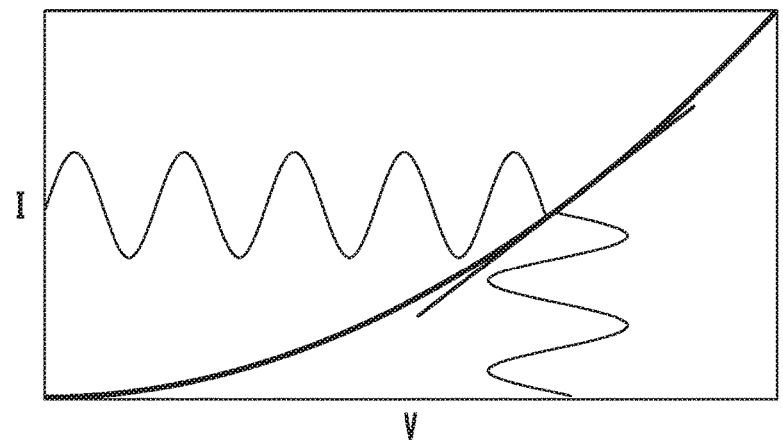
FIG. 11A is a graph of an I-V curve showing a time-varying voltage signal including a dither voltage applied to a dc bias voltage to generate a time varying tip-sample current signal in some embodiments according to the invention.
Figure 11B:
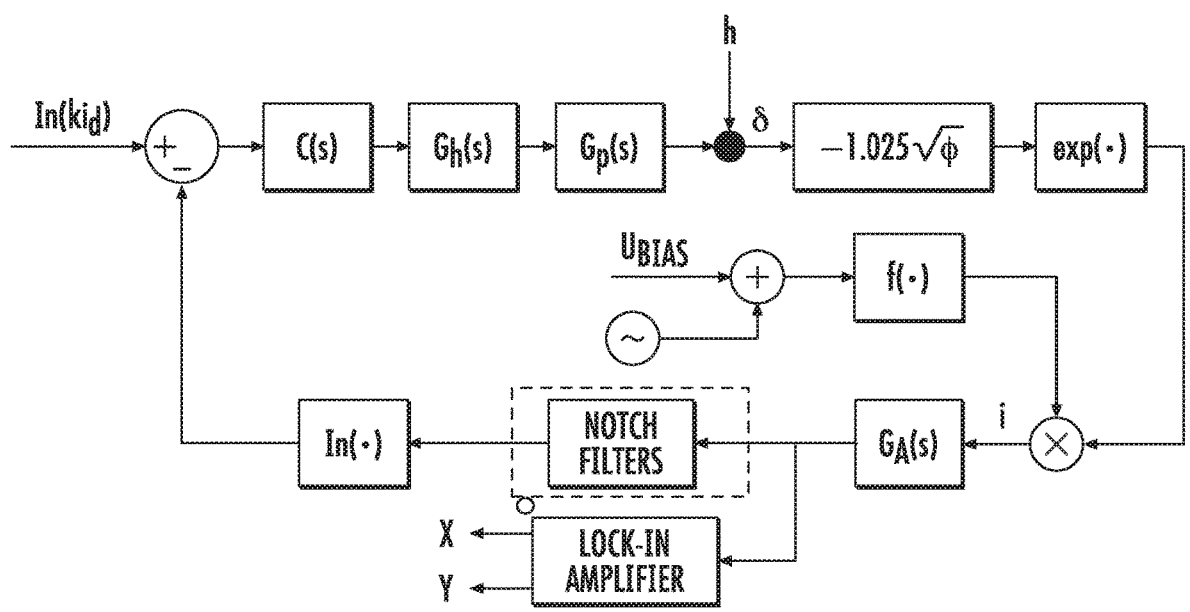
FIG. 11B is a block diagram of an STM system 100 of FIG. 2 having the time-varying voltage signal of FIG. 11A for topographical imaging and including a lock-in amplifier used to generate an ac tunneling current generated at the X output be removing a capacitive current component from the time varying tip-sample current signal in some embodiments according to the invention.

FIG. 11A is a graph of an I-V curve showing a time-varying voltage signal including a dither voltage applied to a dc bias voltage to generate a time varying tip-sample current signal in some embodiments according to the invention. FIG. 11B is a block diagram of an STM system 100 of FIG. 2 having the time-varying voltage signal of FIG. 11A for topographical imaging and including a lock-in amplifier used to generate an ac tunneling current generated at the X output be removing a capacitive current component from the time varying tip-sample current signal in some embodiments according to the invention.

As appreciated by the present inventors, the dither voltage can have an amplitude that is sufficient to generate images with relatively high signal to noise ratio but without significantly adversely the feedback control loop for the STM. In particular, the notch filter can remove the frequency components of the dither voltage so that the STM system is not affected by the dither voltage. Accordingly, the topographical imaging and the spectroscopy imaging can occur simultaneously.

Figure 12:
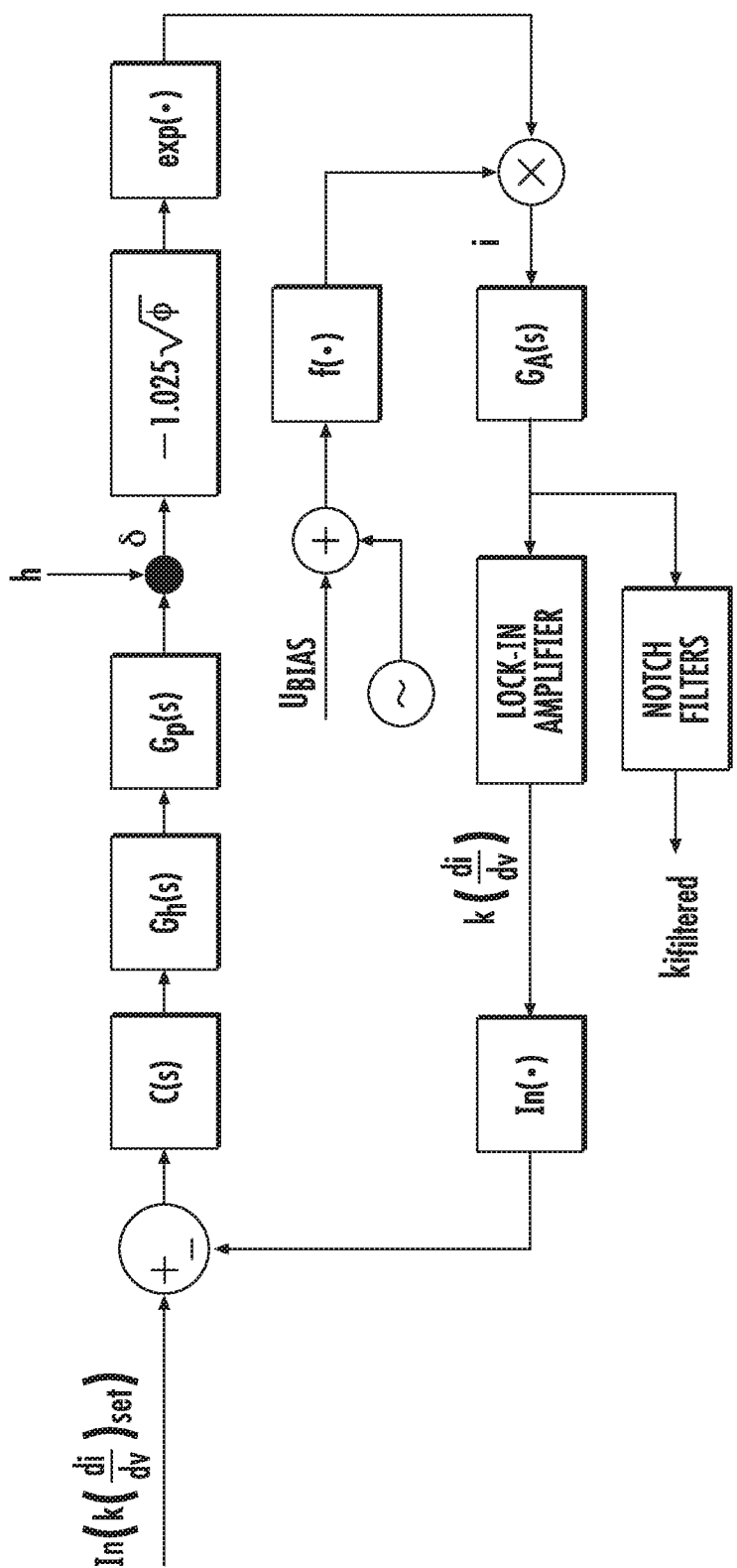
FIG. 12 is a block diagram of an STM system including a control feedback loop that includes a lock-in amplifier that receives a time varying tip-sample current signal to generate an ac tunneling current by removing a capacitive current component from the time varying tip-sample current signal and further includes at least one notch filter to generate a dc current from the time varying tip-sample current signal by removing the frequency components of the time varying tip-sample current signal at the dither voltage signal frequency in some embodiments according to the invention.

FIG. 12 is a block diagram of an STM system including a control feedback loop that includes a lock-in amplifier that receives a time varying tip-sample current signal to generate an ac tunneling current by removing a capacitive current component from the time varying tip-sample current signal and further includes at least one notch filter to generate a dc current from the time varying tip-sample current signal by removing the frequency components of the time varying tip-sample current signal at the dither voltage signal frequency in some embodiments according to the invention.

Figure 13C:
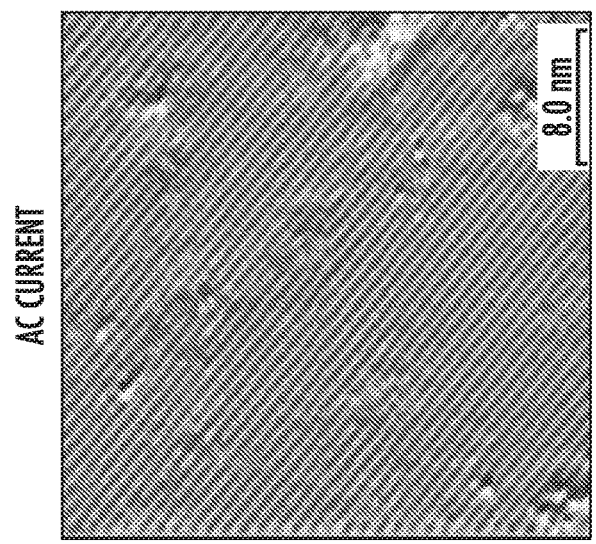
FIGS. 13A-13C show topographic, dc current, and ac current images, respectively, generated simultaneously are a topographical image, using the system shown in FIG. 12 in some embodiments according to the invention.
Figure 13B:
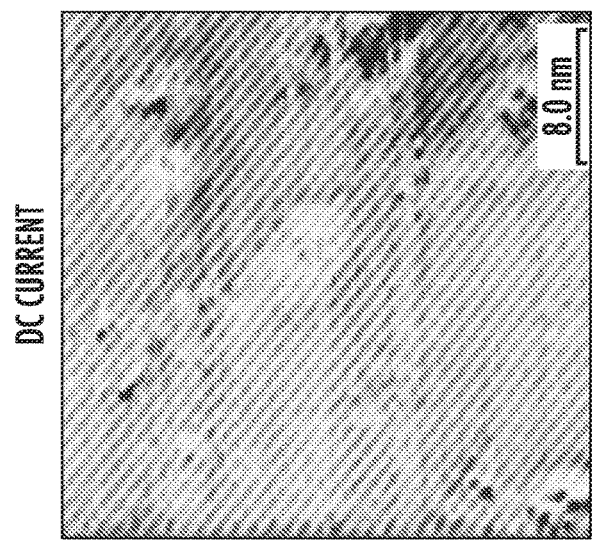
Figure 13A:
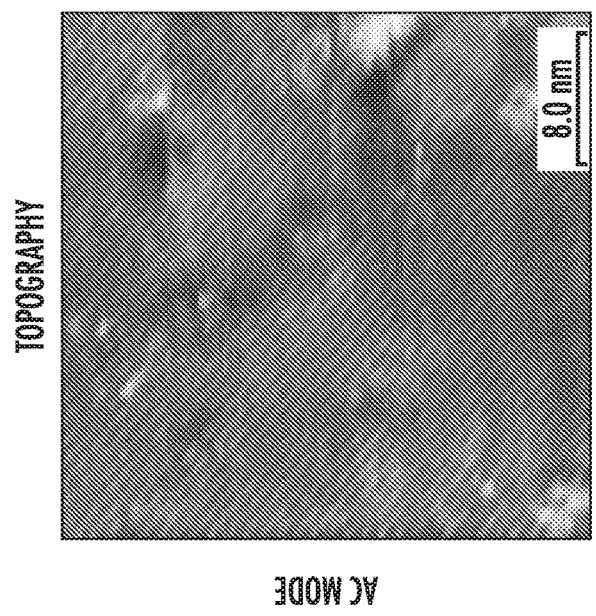

FIGS. 13A-C show topographic, dc current, and ac current images, respectively, generated simultaneously are a topographical image, using the system shown in FIG. 12 in some embodiments according to the invention.

Figure 14:
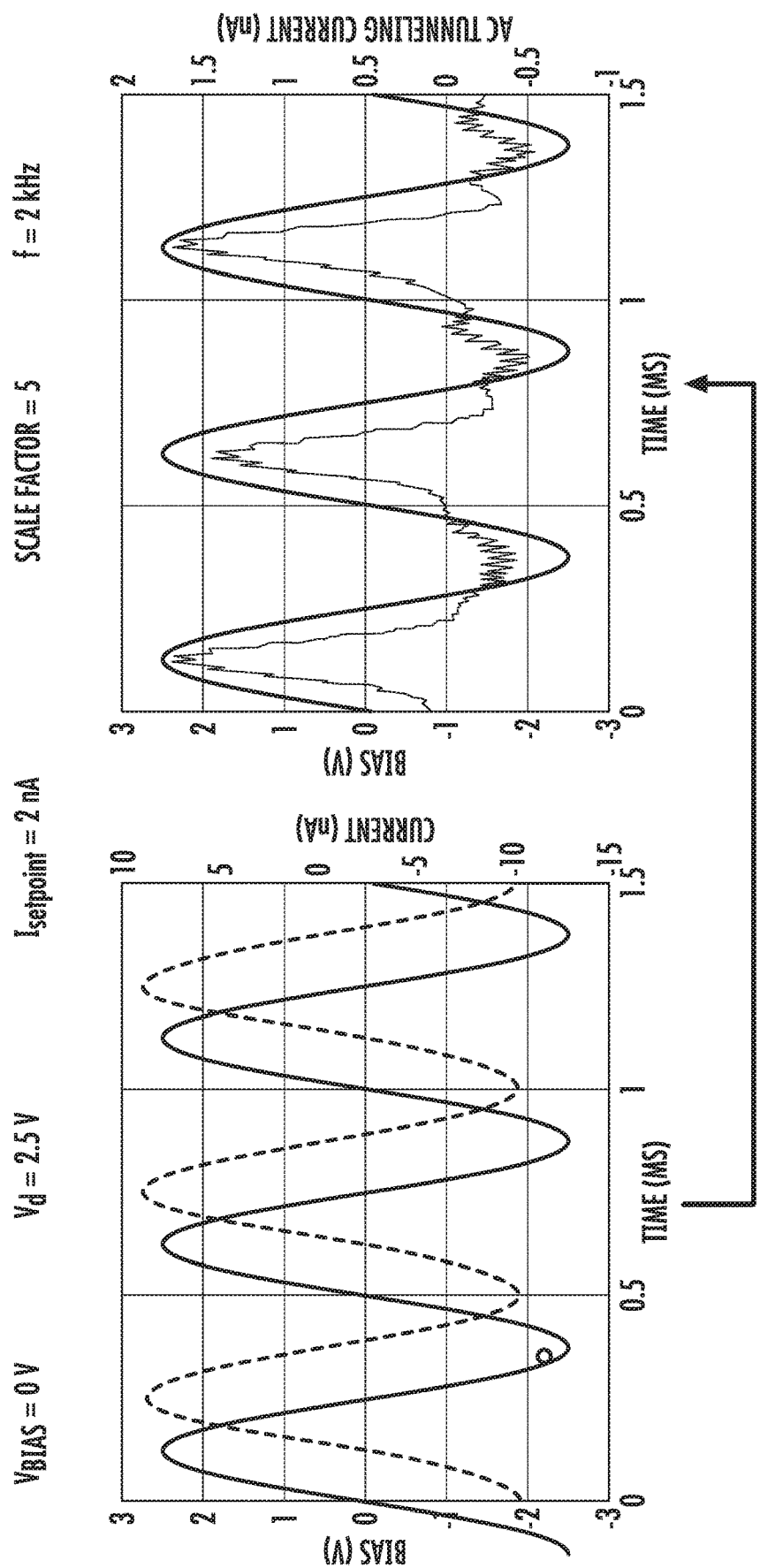
FIG. 14 a time-varying voltage signal applied to the system of FIG. 11B to generate the time varying tip-sample current signal shown, which is processed by the lock-in amplifier to isolate the ac tunneling current by removing the capacitive current component in the time varying tip-sample current signal in some embodiments according to the invention.
Figure 15:
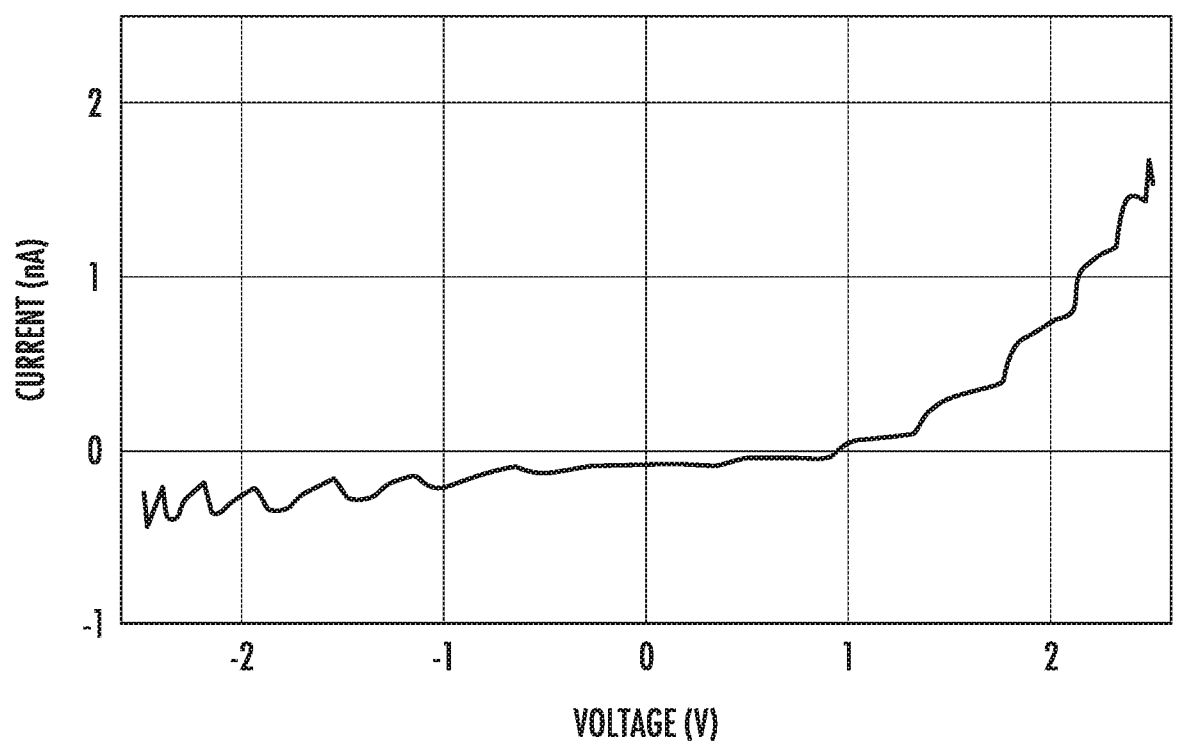
FIG. 15 is an I-V curve for a location on the sample processed by the system shown in FIG. 11B in some embodiments according to the invention.

FIG. 14 a time-varying voltage signal applied to the system of FIG. 12 to generate the time varying tip-sample current signal shown, which is processed by the lock-in amplifier to isolate the ac tunneling current by removing the capacitive current component in the time varying tip-sample current signal in some embodiments according to the invention. FIG. 15 is an I-V curve for a location on the sample processed by the system shown in FIG. 12 in some embodiments according to the invention.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the various embodiments described herein. As used herein, the term "and/or" includes any and all combinations of one or more of the associated listed items.

The terminology used herein is for the purpose of describing particular embodiments only and is not intended to be limiting to other embodiments. As used herein, the singular forms "a,," "an" and "the" are intended to include the plural forms as well, unless the context clearly indicates otherwise. It will be further understood that the terms "comprises," "comprising," "includes" and/or "including", "have" and/or "having" when used herein, specify the presence of stated features, integers, steps, operations, elements, and/or components, but do not preclude the presence or addition of one or more other features, integers, steps, operations, elements, components, and/or groups thereof. Elements described as being "to" perform functions, acts and/or operations may be configured to or other structured to do so.

Unless otherwise defined, all terms (including technical and scientific terms) used herein have the same meaning as commonly understood by one of ordinary skill in the art to which various embodiments described herein belong. It will be further understood that terms used herein should be interpreted as having a meaning that is consistent with their meaning in the context of this specification and the relevant art and will not be interpreted in an idealized or overly formal sense unless expressly so defined herein.

As will be appreciated by one of skill in the art, various embodiments described herein may be embodied as a method, data processing system, and/or computer program product. Furthermore, embodiments may take the form of a computer program product on a tangible computer readable storage medium having computer program code embodied in the medium that can be executed by a computer.

Any combination of one or more computer readable media may be utilized. The computer readable media may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable signal medium may be transmitted using any appropriate medium, including but not limited to wireless, wired, optical fiber cable, RF, etc., or any suitable combination of the foregoing.

Computer program code for carrying out operations for aspects of the present disclosure may be written in any combination of one or more programming languages, including an object oriented programming language such as Java, Scala, Smalltalk, Eiffel, JADE, Emerald, C++, C #, VB.NET, Python or the like, conventional procedural programming languages, such as the "C" programming language, Visual Basic, Fortran 2003, Perl, COBOL 2002, PHP, ABAP, dynamic programming languages such as Python, Ruby and Groovy, or other programming languages, such as a programming language for a FPGA, Verilog, System Verilog, Hardware Description language (HDL), and VHDL. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computer environment or offered as a service such as a Software as a Service (SaaS).

Some embodiments are described herein with reference to flowchart illustrations and/or block diagrams of methods, systems and computer program products according to embodiments. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create a mechanism for implementing the functions/acts specified in the flowchart and/or block diagram block or blocks.

These computer program instructions may also be stored in a computer readable medium that when executed can direct a computer, other programmable data processing apparatus, or other devices to function in a particular manner, such that the instructions when stored in the computer readable medium produce an article of manufacture including instructions which when executed, cause a computer to implement the function/act specified in the flowchart and/or block diagram block or blocks. The computer program instructions may also be loaded onto a computer, other programmable instruction execution apparatus, or other devices to cause a series of operational steps to be performed on the computer, other programmable apparatuses or other devices to produce a computer implemented process such that the instructions which execute on the computer or other programmable apparatus provide processes for implementing the functions/acts specified in the flowchart and/or block diagram block or blocks.

It is to be understood that the functions/acts noted in the blocks may occur out of the order noted in the operational illustrations. For example, two blocks shown in succession may in fact be executed substantially concurrently or the blocks may sometimes be executed in the reverse order, depending upon the functionality/acts involved. Although some of the diagrams include arrows on communication paths to show a primary direction of communication, it is to be understood that communication may occur in the opposite direction to the depicted arrows.

Many different embodiments have been disclosed herein, in connection with the above description and the drawings. It will be understood that it would be unduly repetitious and obfuscating to literally describe and illustrate every combination and subcombination of these embodiments. Accordingly, all embodiments can be combined in any way and/or combination, and the present specification, including the drawings, shall support claims to any such combination or subcombination.

What is claimed:
1. A scanning tunneling device comprising:
  a scanning tunneling tip configured to receive a bias voltage with respect to a sample to be processed by the scanning tunneling device, the bias voltage modulated with a dither voltage at a dither frequency and a dither amplitude; and
  a control system, connected to a z-actuator and an x-y scanner, the control system configured to:
    receive a time varying tip-sample current signal, including components at the dither frequency, tunneling between the tip and the sample; and
    provide the time varying tip-sample current signal as a feedback signal in the control system.
2. The scanning tunneling device of claim 1 wherein the control system is further configured to filter the time varying tip-sample current signal to attenuate the components at the dither frequency to provide a filtered tip-sample current signal as the feedback signal to a control feedback loop of the control system.
3. The scanning tunneling device of claim 2 wherein the control feedback loop has an associated operating bandwidth including an upper frequency limit that is less than the dither frequency.
4. The scanning tunneling device of claim 1 wherein the time varying tip-sample current signal comprises a tunneling current signal that is in-phase with the bias voltage modulated with the dither voltage and a capacitive current signal that is 90 degrees out of phase with the bias voltage modulated with the dither voltage.
5. The scanning tunneling device of claim 4 wherein the scanning tunneling device is configured as a scanning tunneling lithography instrument wherein the control system is configured to:
  operate the x-y scanner to position the tip opposite a location on a surface of the sample;

monitor for an indication of a change in height of the tip above the surface at the location; and.

(a) increment a present value of the dither amplitude to ramp up the bias voltage modulated with a dither voltage at the location while monitoring for the indication of the change in height.

6. The scanning tunneling device of claim 5 wherein the control system is configured to:

(b) indicate desorption of an atom terminating the surface at the location responsive to detecting the indication of the change in the height being greater than a threshold value.

7. The scanning tunneling device of claim 6 wherein the control system is configured to:

return the dither amplitude to a value of about zero volts; and actuate the x-y scanner to position the tip opposite a next location on the surface of the sample responsive to determining that additional positions remain to be processed.

8. The scanning tunneling device of claim 6 wherein the control system is configured to:

(c) indicate lack of desorption of an atom terminating the surface at the location responsive to detecting the indication of the change in the height being less than the threshold value; and perform operations (a)-(c) until the dither amplitude reaches a final value.

9. The scanning tunneling device of claim 4 wherein the scanning tunneling device is configured as a scanning tunneling lithography instrument wherein the control system is configured to:

operate the x-y scanner to position the tip opposite a location on a surface of the sample;

monitor for an indication of a change in the time varying tip-sample current signal; and.

(a) increment a present value of the dither amplitude to ramp up the bias voltage modulated with a dither voltage at the location while monitoring for the indication of the change in the time varying tip-sample current signal.

10. The scanning tunneling device of claim 9 wherein the control system is configured to:

(b) indicate desorption of an atom terminating the surface at the location responsive to detecting the indication of the change in the time varying tip-sample current signal being greater than a threshold value.

11. The scanning tunneling device of claim 10 wherein the control system is configured to:

return the dither amplitude to a value of about zero volts; and operate the x-y scanner to position the tip opposite a next location on the surface of the sample responsive to determining that additional positions remain to be processed.

12. The scanning tunneling device of claim 10 wherein the control system is configured to:

(c) indicate lack of desorption of an atom terminating the surface at the location responsive to detecting the indication of the change in the time varying tip-sample current signal being less than the threshold value; and perform operations (a)-(c) until the dither amplitude reaches a final value.

13. The scanning tunneling device of claim 4 wherein the scanning tunneling device is configured as a scanning tunneling microscope instrument wherein the control system is configured to:

(a) operate the x-y scanner to position the tip opposite a location on a surface of the sample;

(b) measure time varying tip-sample current signal;

(c) determine a measured current from the time varying tip-sample current signal;

(d) adjust a position of the tip above the surface by a controller, which sends a command sinal to a z-actuator to maintain the measured current signal at a predefined value within a control frequency bandwidth of a control feedback loop of the control system;

(e) determine a relative height of the tip based on the command signal of the controller.

14. The scanning tunneling device of claim 13 wherein the measured current comprises a measured amplitude of capacitive current, a measured amplitude of time varying AC tunneling current at a fundamental frequency or higher harmonics, or a measured DC tunneling current.

15. The scanning tunneling device of claim 14 wherein the control system is configured to:

operate the x-y scanner to move the tip approximately parallel to the surface at a set of x-y positions on the surface to provide while carrying out operations (a)-(e).

16. The scanning tunneling device of claim 15 wherein the control system is configured to:

measure the time-varying AC tunneling current as a function of voltage to provide I-V curve data for each position included in the set of x-y positions, corresponding to an image pixel in a scanned image.

* * * * *